(12) United States Patent
Zhang et al.

(10) Patent No.: US 7,613,042 B2
(45) Date of Patent: Nov. 3, 2009

(54) DECODING SYSTEM CAPABLE OF REDUCING SECTOR SELECT AREA OVERHEAD FOR FLASH MEMORY

(75) Inventors: Jiani Zhang, Santa Clara, CA (US); Nian Yang, Mountain View, CA (US); Aaron Lee, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 59 days.

(21) Appl. No.: 11/935,049

(22) Filed: Nov. 5, 2007

(65) Prior Publication Data

US 2009/0116289 A1 May 7, 2009

(51) Int. Cl.
*G11C 16/04* (2006.01)
(52) U.S. Cl. .............................. 365/185.16; 365/185.02
(58) Field of Classification Search ............ 365/185.16, 365/185.02, 195, 189.11
See application file for complete search history.

(56) References Cited

U.S. PATENT DOCUMENTS

| | | | |
|---|---|---|---|
| 5,719,808 | A | 2/1998 | Harari et al. |
| 5,949,713 | A | 9/1999 | Bedarida et al. |
| 5,982,665 | A | 11/1999 | Xing et al. |
| 6,898,662 | B2 | 5/2005 | Gorobets |
| 7,049,652 | B2 * | 5/2006 | Mokhlesi et al. ............ 257/315 |
| 2004/0141439 | A1 | 7/2004 | Suzuki et al. |
| 2005/0157553 | A1 | 7/2005 | Perroni et al. |
| 2008/0130359 | A1 * | 6/2008 | Maayan et al. ......... 365/185.01 |

* cited by examiner

*Primary Examiner*—Vu A Le
(74) *Attorney, Agent, or Firm*—Eschweiler & Associates, LLC

(57) ABSTRACT

Methods and apparatus are disclosed for erasing memory cells in a virtual ground memory core, wherein a row decoder apparatus employs a protective voltage to wordlines of a sector of cells while concurrently providing an erase voltage to selected wordlines of the same physical sector. Decoder circuitry and methods are disclosed for selecting a memory cell sector to be erased and adjacent sectors to be protected, which may be used in single bit and dual bit memory devices, and which enable column decoder circuitry to reduce the number of sector select circuits.

19 Claims, 12 Drawing Sheets

ERASING FIRST BIT TO "1" UTILIZING A GATE ERASE

ERASING SECOND BIT TO "1" UTILIZING A GATE ERASE

DECODING SYSTEM CAPABLE OF REDUCING SECTOR SELECT AREA OVERHEAD FOR FLASH MEMORY

FIELD OF THE INVENTION

The present invention relates generally to memory devices and the like, and in particular, to a system and method of reducing sector select area overhead for flash memory.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells are typically comprised of a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell MOS device, in an erase or program operation the voltages are applied so as to cause a charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

In single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The slacked gate also includes a polysilicon floating gate overlying the tunnel oxide and an interpoly dielectric layer overlying the floating gate. The interpoly dielectric layer is often a multi-layer insulator such as an oxide-nitride-oxide (ONO) layer having two oxide layers sandwiching a nitride layer. Lastly, a polysilicon control gate overlies the interpoly dielectric layer.

"Hot" (high energy) electrons in the channel near the drain can program a typical single bit type memory cell, which results from a relatively high voltage to the control gate and a moderately high voltage to the drain region. The hot electrons accelerate across the tunnel oxide and into the floating gate, which become trapped in the floating gate because of surrounding insulators. As a result of the trapped electrons, a threshold voltage of the memory cell increases. This change in the threshold voltage (and thereby the channel conductance) of the memory cell created by the trapped electrons is what causes the memory cell to be programmed.

To read the memory cell, a predetermined gate voltage greater than the threshold voltage of an unprogrammed memory cell, but less than the threshold voltage of a programmed memory cell, is applied to the gate. If the memory cell conducts (e.g., a sensed current in the cell exceeds a minimum value), then the memory cell has not been programmed (the memory cell is therefore at a first logic state, e.g., a one "1"). If, however, the memory cell does not conduct (e.g., the current through the cell does not exceed a threshold value), then the memory cell has been programmed (the memory cell is therefore at a second logic state, e.g., a zero "0"). Thus, each memory cell may be read in order to determine whether it has been programmed (and therefore identify the logic state of the data in the memory cell).

EEPROM memory, such as flash memory is a type of non-volatile electronic memory media which can be rewritten and hold its content without power. Flash memory devices generally have life spans from 100K to 10 MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell.

More recently, flash memory devices have incorporated dual bit cell architectures, in which the core cells can each store two data bits. Dual bit memory cells are generally symmetrical, wherein the drain and source terminals are interchangeable. When appropriate voltages are applied to the gate, drain, and source terminals, one of the two bits may be accessed (e.g., for read, program, erase, verify, or other operations). When another set of terminal voltages are applied to the dual bit cell, the other of the two bits may be accessed.

Core cells in flash memory devices, whether single bit or multiple-bit, may be interconnected in a variety of different configurations. For instance, cells may be configured in a NOR configuration, with the control gates of the cells in a row individually connected to a wordline. In addition, the drains of the cells in a particular row are connected together by a conductive bitline. In the NOR configuration, each drain within a single column is connected to the same bitline. In addition, each flash cell associated with a given bitline has its gate coupled to a different wordline, while all the flash cells in the array have their source terminals coupled to a common source terminal, such as Vss or ground. In operation, individual flash cells in such a NOR configuration are addressed via the respective bitline and wordline using peripheral decoder and control circuitry for programming (writing), reading, erasing, or other functions.

Another cell configuration is known as a virtual ground architecture, in which the gates of the core cells in a row are tied to a common wordline. A typical virtual ground architecture comprises rows of flash memory core cell pairs with a drain of one cell transistor coupled to an associated bitline and the source of the adjacent core cell transistor. An individual flash cell is selected via the wordline and a pair of bitlines bounding the associated cell. For instance, such a cell may be read by applying voltages to the gate (e.g., via the common wordline) and to a bitline coupled to the drain, while the source is coupled to ground (Vss) via another bitline. A virtual ground is thus formed by selectively switching to ground the bitline associated with the source terminal of only those selected flash cells which are to be read. In this regard, where the core cells are of a dual bit type, the above connections can be used to read a first bit of the cell, whereas the other bit may be similarly read by grounding the bitline connected to the drain, and applying a voltage to the source terminal via the other bitline.

State of the art high performance flash memory devices, such as ORNAND/NOR/NAND devices can achieve a density substantially higher than the conventional EEPROM non-volatile memory and is suitable for the mass storage and code storage in commercial as well as consumer products. As modern day flash memory and other non-volatile memory demands smaller and smaller area while maintaining or increasing density, efficiently using die size is an increasingly more important issue than in the past. Although technology has been able to scale down the size of core cells significantly, neighboring decoding circuits cannot keep up with the scaling of the core arrays mainly due to the electrical properties of the core cell operation. As a result, these decoding circuits, also known as sector selects, greatly overpower the core cell in area thereby creating severe overhead in silicon area consumption and making down scaling highly inefficient. Additionally, as these sector selects are repeated throughout the die and occur as many times as sectors themselves, their overhead penalty is multiplied and even more severe. Hence, there is a need for improved methods and apparatus by which the adverse effects of the overhead penalty can be reduced or mitigated in flash memory devices.

SUMMARY OF THE INVENTION

The following presents a simplified summary in order to provide a basic understanding of some aspects of the invention. This summary is not an extensive overview. It is intended neither to identify key or critical elements of disclosure nor to delineate the scope of the disclosure. Rather, the primary purpose of this summary is to present some concepts in a simplified form as a prelude to the more detailed description that is presented later. The invention provides methods and apparatus by which the above shortcomings associated with a multiplicity of sector select circuits can be mitigated or overcome.

In accordance with one aspect of the disclosure, a memory device, comprising a physical sector comprising a plurality of core sectors organized in a virtual ground configuration. Each core sector comprises a plurality of memory cells, a plurality of gate terminals coupled to at least one wordline, a plurality of drain terminals coupled to at least one bitline and a plurality of source terminals coupled to at least one bitline. The memory device further comprises a decoder operatively coupled to the at least one wordline of the plurality of core sectors. The decoder is configured to maintain isolated control of the at least one wordline of the plurality of core sectors and is further configured to inhibit at least one core sector by generating an inhibiting voltage to the at least one core sector within the physical sector.

In another embodiment of the disclosure, a method of manufacturing a memory device comprises forming a physical sector comprising a plurality of core sectors. Each core sector comprises a plurality of memory cells, a plurality of gate terminals coupled to at least one wordline, a plurality of drain terminals coupled to at least one bitline and a plurality of source terminals coupled to at least one bitline. The method further comprises isolating control of at least one core sector within the physical sector and generating an inhibiting voltage to at least one wordline of the plurality of core sectors within the physical sector by a decoder.

In yet another embodiment of the disclosure, a communication device comprises a flash memory CPU. The flash memory is operatively coupled to the CPU and configured to transfer data to and from the CPU. The device further comprises an input component for entering the data, a display component for displaying information, a plurality of switches, flash memory, a physical sector and a method of forming a physical sector comprising a plurality of core sectors. The communication device further comprises a method of forming a physical sector comprising a plurality of core sectors. Each core sector comprises a plurality of memory cells, a plurality of gate terminals coupled to at least one wordline, a plurality of drain terminals coupled to at least one bitline, and a plurality of source terminals coupled to at least one bitline. The method further comprises isolating control of at least one core sector within the physical sector and generating an inhibiting voltage to at least one wordline of the plurality of core sectors within the physical sector by a decoder while concurrently generating an erase voltage to at least one wordline of the plurality of core sectors. The decoder comprises a row decoder, a circuit for generating a high voltage signal and a sub circuit for passing a control signal for a negative voltage to be generated to at least one wordline of the plurality of core sectors or a positive voltage to at least one core sector of the plurality of core sectors. Generating the inhibiting voltage comprises generating a high positive voltage from a VWL node and generating the negative voltage comprises generating a high negative voltage from a minus voltage or a float. A column decoder is also formed comprising a sense amplifier and two sector select circuits coupled to and shared among the plurality of core sectors.

To the accomplishment of the foregoing and related ends, the following description and annexed drawings set forth in detail certain illustrative aspects and implementations of the disclosure. These are indicative of but a few of the various ways in which the principles disclosed may be employed. Other objects, advantages and novel features of the invention will become apparent from the following detailed description when considered in conjunction with the drawings.

DETAILED DESCRIPTION OF THE INVENTION

Figure 1:
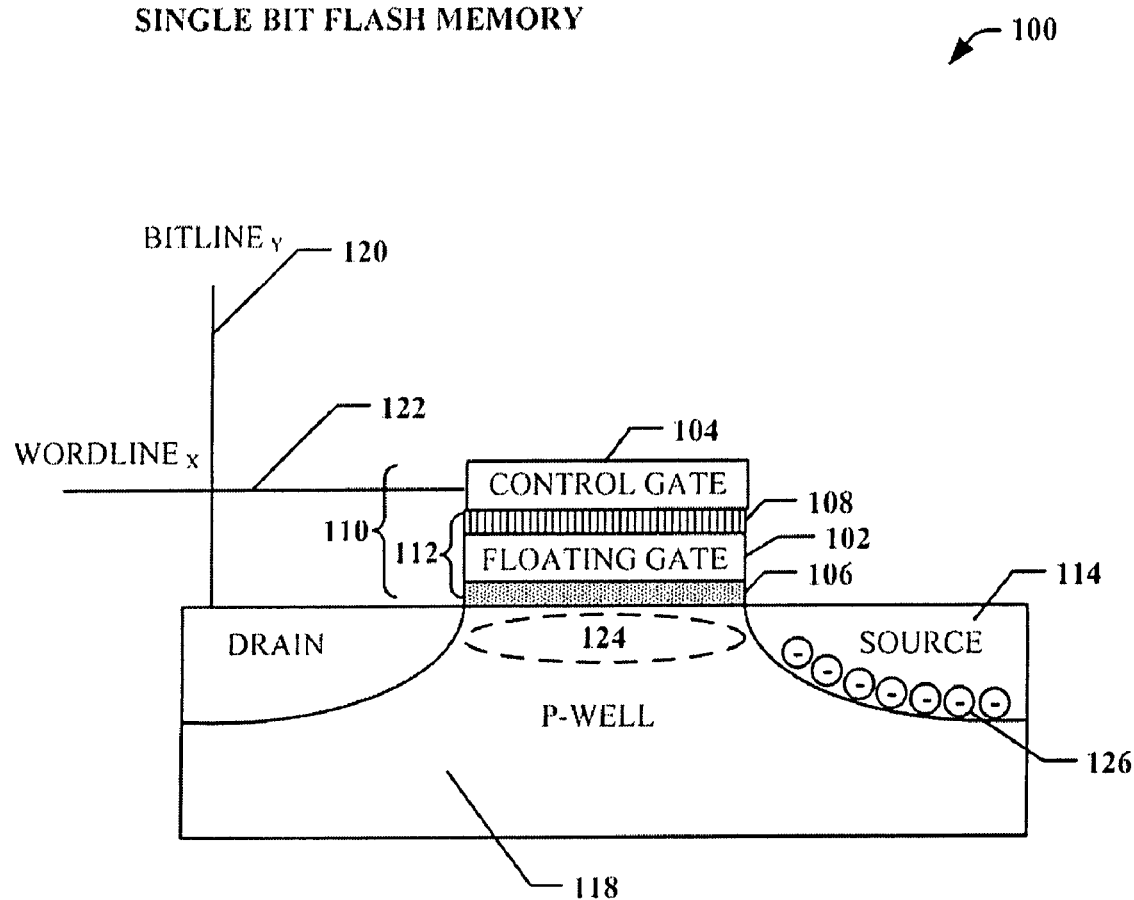
FIG. 1 is a cross-sectional view illustrating a single bit stacked gate flash memory cell according to one aspect of the present disclosure.

One or more implementations of the present invention will now be described with reference to the drawings, wherein like reference numerals are used to refer to like elements throughout. The present disclosure is directed to a row decoder apparatus and method for employing an inhibiting or protective voltage to wordlines of a sector of cells while concurrently providing an erase voltage to selected wordlines of the same sector of cells. A fundamental advantage of this approach is that sector select circuits of a column decoder are capable of being reduced. In addition, the overhead area of a semiconductor die is greatly reduced and memory cell sectors can be more densely compressed. Furthermore, less control circuitry is required for a row decoder providing erase voltages to wordlines of a sector.

Referring now to the figures, FIG. 1 is a cross sectional illustration of a stacked gate type flash memory cell 100 that may be employed in accordance with one aspect of the present invention. It is to be appreciated that although the explanation with respect to FIG. 1 is a single bit cell, with slight modification it can refer to a dual bit cell, to be discussed in detail infra. The memory cell 100 can be fabricated, for example, by employing semiconductor processes including hundreds of manufacturing steps to fabricate the flash memory cell 100 within a cell memory core and surrounded by layers of electrical interconnections, around the periphery. The flash memory cell 100 is constructed wherein data or information is stored within the flash memory cell 100 on a floating gate 102. The flash memory cells 100 can be constructed or layered on a semiconductor substrate 118 with a conducting bitline 120 (BITLINEY) attached to a drain 116. A conductive wordline 122 (WORDLINEX), associated with a row of such cells, is connected to a control gate 104 that is formed over a dielectric composite layer 112, and the WORDLINEX 122 is substantially perpendicular to a BITLINEY 120 in a typical NOR (logical NOT OR) type configuration. The conductive BITLINEY 120 connects the various drains in the column of cells including the cell 100 that can be referred to as CELLXY 100. The basic flash memory CELLXY 100 is similar to a metal oxide semiconductor field effect transistor (MOSFET) that has been adapted to incorporate the isolated inner floating gate 102 (e.g., made of polysilicon) between the external control gate 104 and a silicon substrate (P-well) 118. The inner floating gate 102 functions as the data-storing element of the flash memory cell 100. A stacked gate 110 includes the floating gate 102 sandwiched between the tunnel oxide dielectric 106 and an isolation or control dielectric 108 upon which the control gate 104 resides. In other words the floating gate 102 is entirely insulated all around by oxide and the oxide-nitride-oxide layer 112, thus formed, is often referred to as an "ONO layer". A substrate channel 124 formed between the source 114 and drain 116 regions conducts current between the source 114 and drain 116 in accordance with an electric field formed within the channel 124 by a voltage applied to the WORDLINEX 122 (attached to the control gate 104) and a voltage applied to the BITLINEY (attached to the drain 116). Typically, the source 114 terminal of each cell 100 is connected to a common source terminal: Any electrons placed on or within the floating gate 102 get "trapped" there, isolated by the surrounding oxide insulation, 106 and 108, and thus the floating gate 102 stores charge, indicative of words, data or information.

The floating gate 102 is typically comprised of a conductive material, for example, polysilicon and the like, and is typically deposited on the tunnel oxide 106. The tunnel oxide 106 is deposited on the substrate channel assembly 124 or the P-well/substrate 118.and is thin, so that the likelihood of electrons tunneling across or through it (from the semiconductor channel 124 to the floating gate 102) is high. The tunnel oxide 106 can be made of Si, SiO2, AlO and the like.

The programming circuitry controls one cell 100 by applying a first voltage to the wordline 122, which acts as the control gate 104 voltage, and a second voltage to the bitline 120 which acts as the drain 116 voltage. The basic flash memory cell 100 is, for example, like an NMOS transistor that has been modified with the "floating" gate 102. The writing aspect of NOR memory cell 100 programming, for example, takes place to obtain a "0" bit when a positive voltage is applied to both the bitline 120 (associated with the drain 116) and the wordline 122 (control gate 104) simultaneously, electrons 126 begin to flow from the source 114 region to the drain 116 region. As electrons flow from the source 114 to the drain 116, the large positive voltage placed on the control gate 104 provides an electrical field strong enough to draw electrons 126 through the tunnel oxide 106 and up into the floating gate 102, a process called channel hot-electron injection. The resultant high electric field across the tunnel oxide 106 results in a phenomenon called "Fowler-Nordheim" tunneling. During Fowler-Nordheim tunneling, electrons move from the source 116 into the channel region 124 and tunnel through the oxide layer 106 into the floating gate 102 and become trapped in the gate 102 since the floating gate is surrounded by oxide layers, 106 and 108. If the resultant negative charge on the floating gate 102 is above a selected threshold level, the bit is referred to as "programmed" and the cell is defined as a "zero".

The flash memory cell 100 can employ two states, for example, a "written" or "programmed" state ("0" state) and an "erased" state ("1" state), in order to store data or information. The charge level "trapped" within or on the floating gate 102 determines the flash cell 100 state by shifting the threshold voltage (Vt) of the control gate 104 that allows current to flow from the source 114 to the drain 116. The change in the threshold voltage (and associated channel 124 conductance) of the cell 100 produced by the trapped electrons 124, as discussed supra, results in the cell being "programmed". To erase (reset the cells to all 1's) a NOR flash cell 100, a large voltage differential is placed between the control gate 104 and source 114, which pulls the electrons off of the floating gate 102 through quantum tunneling. Most modern NOR flash memory components are made up of various "erase segments", usually called either "blocks" or "sectors". All of the memory cells 100 in a block are erased at the same time, however, NOR "programming" can generally be performed one byte or word at a time. An erased state "1" occurs when the charge of the floating layer or gate 102 does not influence the threshold voltage, or alternatively, a programmed state "0" is present when the charge level of the floating gate does sufficiently influence or change the threshold voltage of the control gate 104 beyond a predetermined level.

In single bit flash memory devices and systems, erase verification is performed to determine whether each cell in a block or set of cells has been appropriately erased. Present single bit erase confirmation methodologies and strategies afford verification of bit or cell erasure, and submission of additional erase pulses can be sent to individual cells that fail the verification process. Thereafter, the erased condition of the cell is again verified and the process continues until the cell or bit is successfully erased or the cell is "marked" as no longer viable.

However, one problem that occurs is that a large disparity or wide distribution of threshold voltages occurs after erasures have resulted in making the non-volatile semiconductor memory devices unstable, such that precise memory events of the devices are no longer possible. In addition, another problem is that a large erasure voltage required to erase a cell 100 can result in uncontrolled junction avalanche that changes erasure characteristics, which result in long-term device reliability issues. The life span of flash memory is usually measured in terms of the number of erase cycles that can be completed. The number of cycles varies from device to device, but published ranges are from 10,000 to 1,000,000 erase cycles. Erasure voltages can often result in the decreased lifetime of a device. As with many aspects of the semiconductor industry, there is a continuing desire to increase the reliability of the devices while concurrently reducing the size of the devices.

Figure 2:
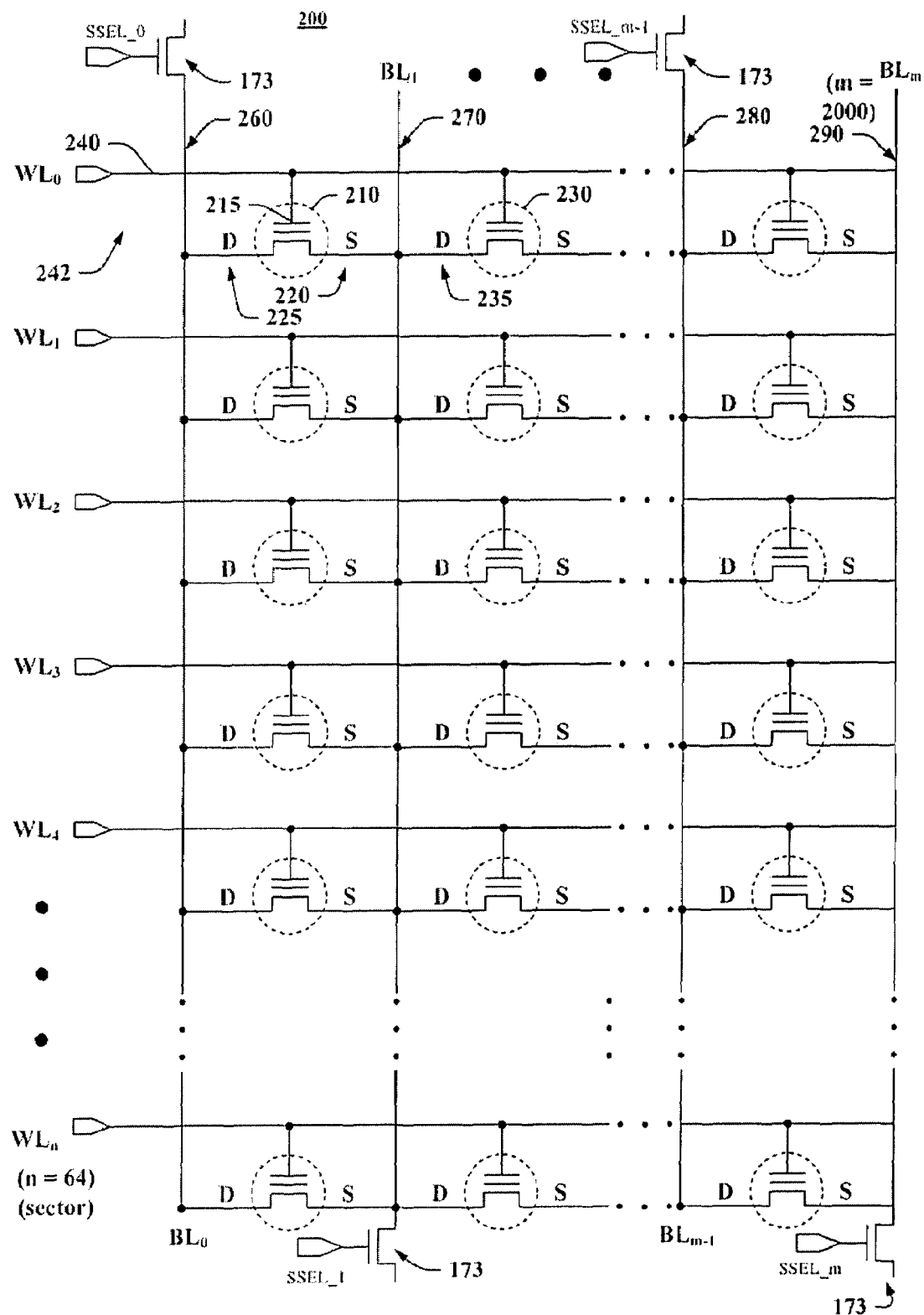
FIG. 2 is a schematic of an exemplary illustration of a partial sector array of wordlines and bitlines of flash memory cells in a NOR type architecture in accordance with one aspect of the present disclosure.

Referring now to FIG. 2, a "virtual ground" architecture is illustrated as one embodiment of the disclosure. A memory core 200 is illustrated comprising flash cells 210 with stacked gate terminals 215 coupled to an associated wordline (e.g., $WL_0$ thru $WL_n$) 240, wherein the wordline 240 is associated with a row 242 of such cells to form sectors. The memory core 200 further comprises bitline columns (e.g., 260, 270, 280, 290) of flash cell pairs (e.g., 210 & 230) with a drain 235 of one memory cell 230 coupled to an associated bitline (e.g., $BL_0$ thru $BL_m$) and the source 220 of the adjacent memory cell 210 as well. In addition, each bitline is coupled to peripheral circuitry such as decode circuitry or associated sector selects 173 outside of the memory core 200.

It is noted that in FIG. 2, single bit stacked gate cells are illustrated solely for purposes of illustration and that virtual ground architectures are equally applicable to both single and multiple bit cell types. In addition, each single row of flash cells (e.g., 210 & 230) associated with a wordline 240 is connected in series, with the source 220 of one cell 210 coupled to the drain 235 of an adjacent cell 230, wherein each drain terminal of the transistors within a single column is connected to the same bitline. Individual flash cells may be selected via the wordline and a pair of bitlines bounding the associated cell. Thus, when a positive voltage is applied to the bitline ($BL_0$) 260 coupled to the drain 225 of the flash cell 210, a conductive path is established between the drain 225 and the source 220 thereof, which is coupled to the bitline ($BL_1$) 270 and to ground ($V_{SS}$). In operation, individual flash cells are addressed via the respective bitline and wordline using, for example, a peripheral decoder and/or control circuitry for programming (writing), reading or erasing functions.

For example, a dual bit stacked gate flash memory cell 210 is programmed, for example, by applying a relatively high voltage to the control gate 215 and connecting the source 220 to ground and the drain 225 to a predetermined potential above the source 220. A resulting high electric field across the tunnel oxide leads to phenomena called "Fowler-Nordheim" tunneling that allows electrons in the core cell channel region to tunnel through the tunnel oxide into the floating gate and become trapped in the floating gate given that the floating gate is surrounded by the oxide dielectric and the tunnel oxide. As a result of the trapped electrons, the threshold voltage (Vt) of the cell 210 increases. This change in the threshold voltage (and thereby the channel conductance) of the cell 210 created by the trapped electrons is what causes the cell 210 to be programmed or set to "0".

In order to erase a typical dual bit stacked gate flash memory cell 210, a relatively high positive voltage is applied to the source 225, and the control gate 215 is held at a negative potential, while the drain 225 is allowed to float. Under these conditions, a strong electric field is developed across the tunnel oxide between the floating gate and the source 220. The electrons that are trapped in the floating gate, flow toward and cluster on the portion of the floating gate, overlying the tunnel oxide, and are extracted from the floating gate and into the source 220 region by way of Fowler-Nordheim tunneling through the tunnel oxide. As the electrons are removed from the floating gate, the cell 210 is erased or set to "1".

For read operations, a certain voltage bias is applied across the drain 225 to source 220 of the memory cell 210. The drain 225 of the cell 210 is connected to the bitline 260, which may be connected to the drains of other cells in a byte or word group. The voltage at the drain 225 in conventional stacked gate memory cells is typically provided at between 0.5 and 1.0 volts in a read operation. A voltage is then applied to the control gate 215 (e.g., the wordline 240) of the memory cell transistor 210 in order to cause a current to flow from the source 220 to the drain 225. The read operation control gate 215 voltage is typically applied at a level between a programmed threshold voltage (Vt) and an un-programmed threshold voltage. The resulting current is measured, by which a determination is made as to the data value stored in the cell 210.

Figure 3A:
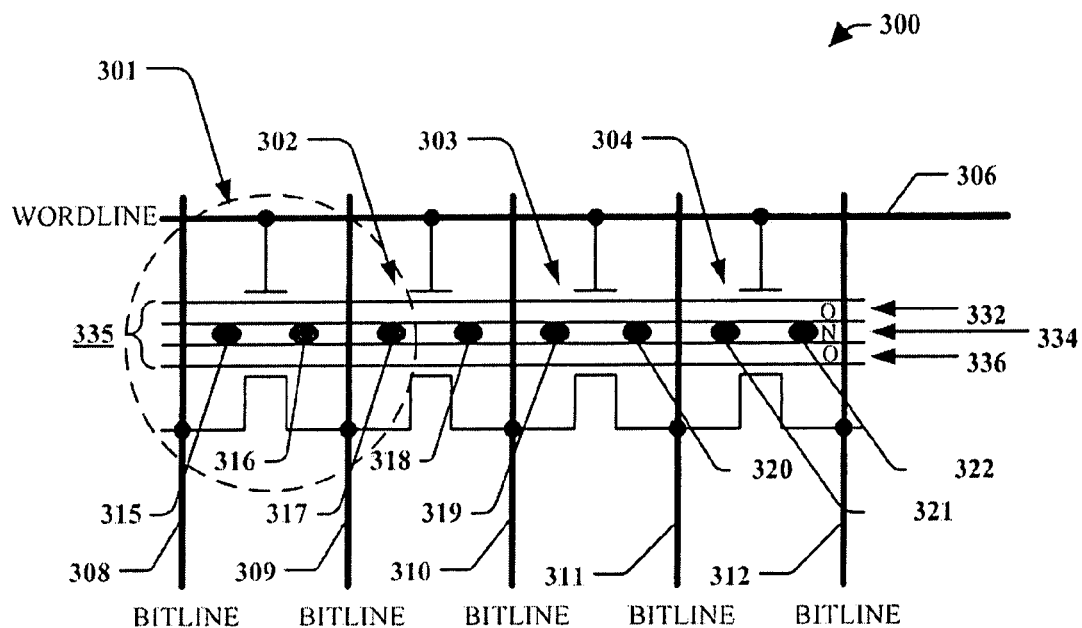
FIG. 3a is a schematic of a portion of a wordline and several associated bitlines in accordance with an aspect of the present disclosure illustrating as dual-bit type memory is a virtual ground type architecture.

Turning to FIG. 3a, a schematic illustration is presented of a portion 300 of a memory core such as may include at least a portion of one of the M by N array cores that employs dual bit flash memory (which will be explained in detail infra). The circuit schematic shows a group of four memory cells 301 through 304 in a "virtual ground" type implementation, for example. The respective memory cells 301 through 304 are connected to a wordline 306, which serves as a control gate, and pairs of the memory cells share a common bitline. For instance, in the example shown, the memory cell 301 has associated bitlines 308 and 309; the memory cell 302 has associated bitlines 309 and 310; the memory cell 303 has associated bitlines 310 and 311; and the memory cell 304 has associated bitlines 311 and 312. As such, cells 301 and 302 share bitline 309, cells 302 and 303 share bitline 310 and cells 303 and 304 share bitline 311, respectively.

Depending upon wordline voltages and bitline connections, the memory cells 301 through 304 are capable of writing, reading, and erasing bits at locations 315 through 322. In addition to voltages applied to the wordline 306, control of the bit at location 315, for example, is achieved through connection of the drain to the bitline 308 and the source to the bitline 309. Similarly, control Of the bit at location 316 is achieved through connection of the drain to the bitline 309 and the source to the bitline 308. Storage of multiple bits is made possible, at least in part, by a dielectric layer 335 interposed between the bitlines and the wordline. The dielectric layer 335 includes multiple insulating layers 332. 336 (e.g., oxide based material) sandwiching a charge trapping layer 334 (e.g., of nitride based material). Given its layer-to-layer composition, oxide-nitride-oxide, the dielectric layer 334 is often referred to as an ONO layer 335 in one example.

The ONO layer 335 allows the different bits to be stored at multiple states or levels as well. For example, depending upon the voltage applied to the memory cells 301 through 304 by the control gate or wordline 306 during programming, varying amounts of charge can be stored at locations 315 through 322. The different amounts of charge may correspond to different bit electrical states or levels, for example. If four different charge levels (e.g., 1, 2, 3 and 4) can be stored at each of the bit locations 315 through 322, for example, then each two-bit cell 301 through 304 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 3B:
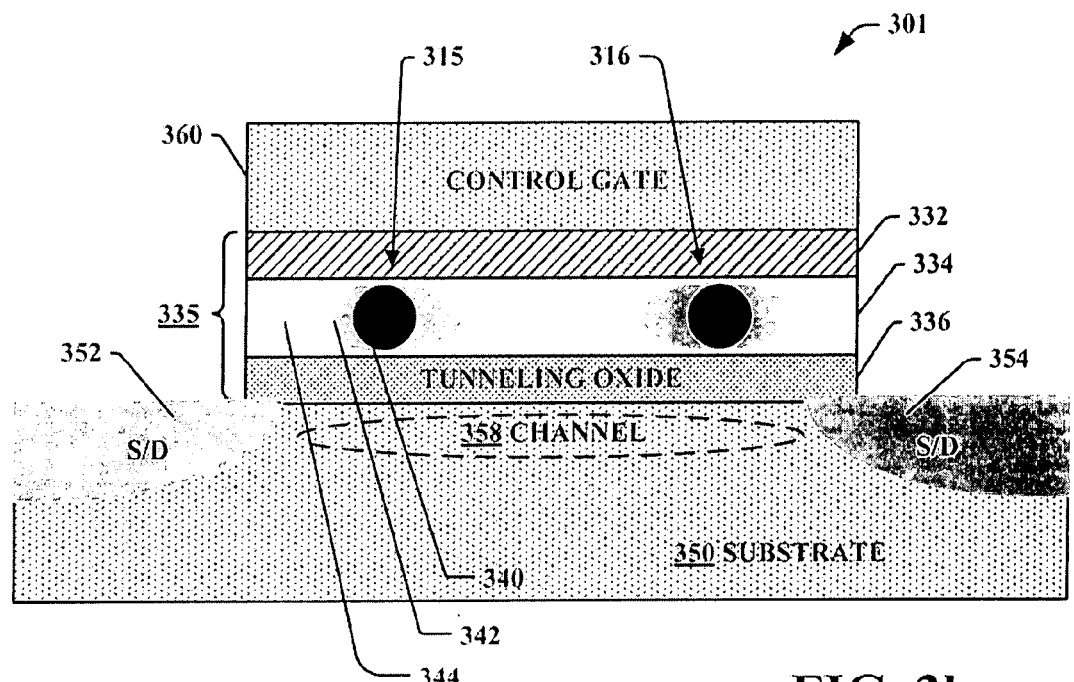
FIG. 3b is a cross-sectional view of a dual bit type flash memory cell wherein each of the bits can be potentially stored at multiple levels in accordance with an aspect of the present disclosure.

FIG. 3b is a cross sectional view of the dual bit memory cell 301 illustrating the capability of the cell to store varying degrees of charge at left and right dual bit locations 315, 316, according to an exemplary embodiment of the present invention. The dual bit flash memory cell 301 uses what is known in the art as "virtual ground" architecture in which the source of one bit (e.g., left bit) serves as the drain of the adjacent bit (e.g., right bit). During read operations the junction nearest the bit being read is the ground terminal (source) and the other side of the cell is the drain terminal (drain), this is called "reverse read". It will be appreciated that the memory cell 301 may, for example, correspond to any of the memory cells. 301 through 304 depicted in FIG. 3a. The cell 301 includes a dielectric layer 335 that comprises a charge trapping layer 334 sandwiched between two dielectric layers 332 and 336. The charge trapping layer 334 is formed from one or more substantially non-conductive substances, such as nitride based materials. The dielectric layers 332, 336 are similarly formed from one or more electrically insulating substances, such as oxide based materials. The layer to layer arrangement, for example, oxide, nitride, oxide layer of the dielectric layer 335 often leads it to be referred to as an ONO layer.

The charge trapping layer 335 is formed over a substrate 350 that may be formed from silicon or some other semiconductor material, for example. The substrate 350 may be selectively doped with a p-type dopant, such as boron, for example, to alter its electrical properties. In the example illustrated, the substrate 350 has buried bitlines or bitline diffusions including a first bitline diffusion 352 and a second bitline diffusion 354. The bitline diffusions 352 and 354 may, for example, be formed by an implanted n-type dopant, and may correspond to bitlines 308 through 312 in FIG. 3a. A channel 358 is defined within the substrate between the first 352 and second 354 bitline diffusions (e.g., S/D extensions, deep S/D regions).

Overlying the upper dielectric layer 332 of the dielectric layer 334 is a gate 360 (control gate). This gate 360 may be formed from a polysilicon material, for example, and may be doped with an n-type impurity (e.g., phosphorus) to alter its electrical behavior. The gate may, for example, correspond to the wordline 306 in FIG. 3a. The gate 360 enables a voltage to be applied to the cell 301 such that respective charges can, among other things, be stored within the cell at locations 315, 316, depending upon the electrical connections of the bitline diffusions 352, 354.

The dual bit memory cell 301 is generally symmetrical, thus the bitline diffusions 352 and 354 are interchangeable as acting source and drain. Thus, the first bitline diffusion 352 may serve as the source and the second bitline diffusion 354 as the drain with respect to right bit location 316. Likewise, the second bitline diffusion 354 may serve as the source and the first bitline diffusion 352 as the drain for the left bit location 315. The cell 301 can be programmed (set to "0") by applying a voltage across the gate 360 and an acting drain region, and connecting an acting source region to ground.

When programming the cell 301, the second bitline diffusion 354 becomes the "acting" drain region 354 and is typically biased to a potential above the first bitline diffusion 352 or the "acting" source 352. As a result of the gate bias, a high electric field is applied across the charge trapping layer 334. Due to a phenomenon known as "carrier hot electron injection" (CHE), electrons pass from the acting source region 352 through the lower dielectric layer or tunneling oxide 336 and become trapped in the charge trapping layer 334 at locations 315 or 316. It will be appreciated that a second bit can be programmed to the alternate location 315 or 316 by reversing the acting source 352 and drain 354 and again applying a bias to the control gate 360.

By way of example, the left bit location 315 can be programmed by applying a program voltage to the gate 360 and a drain voltage to the second bitline 352, which is an acting drain for the left location 315. The first bitline 352, which is an acting source for programming the left bit location 315, can be, for example, connected to ground, left to float, biased to a different voltage level. The applied voltages generate a vertical electric field through the dielectric layers 336 and 332 and also through the charge trapping layer 334, and generate a lateral electric field across a length of the channel 358 from the first bitline diffusion 352 to the second bitline diffusion 354. At a given voltage, the channel 358 inverts such that electrons are drawn off the acting source 352 (the first bitline diffusion 354 in this example) and begin accelerating towards the acting drain 354 (the second bitline diffusion 352 in this example).

As the electrons move along the length of the channel 358, the electrons gain energy and, upon attaining enough energy, the electrons jump over the potential barrier of the bottom dielectric layer 336 and into the charge trapping layer 334, where the electrons become trapped. The probability of electrons jumping the potential barrier in this arrangement is a maximum in the area of the left bit location 315, adjacent the first bitline diffusion 352, where the electrons have gained the most energy. These accelerated electrons are termed hot electrons and, once injected into the charge trapping layer 334, stay in about the general area indicated for the left bit 315. The trapped electrons tend to remain generally localized due to the low conductivity of the charge trapping layer 334 and the low lateral electric field therein. Programming the right bit location 316 is similar, but the first bitline 354 operates as an acting drain and the second operates as an acting source 352.

For a read operation, a certain voltage bias is applied across an acting drain 354 to an acting source 352 of the cell 301. The acting drain of the cell is a bitline, which may be connected to the drains of other cells in a byte or word group. A voltage is then applied to the gate 360 (e.g., the wordline) of the memory cell 301 in order to cause a current to flow from the acting source 352 to the acting drain 354. The resulting current is measured, by which a determination is made as to the value of the data stored in the cell. For example, if the current is above a certain threshold, the bit is deemed un-programmed or a logical "1", whereas if the current is below a certain threshold, the bit is deemed to be programmed or a logical "0". A second bit 316 can be read by reversing operations of the first and second bitline diffusions 352 and 354 for the acting drain and the acting source.

It can be appreciated that if the voltages utilized to program the left 315 and right 316 bit locations of the cell 301 are increased or sustained for longer periods of time, the number of electrons or amount of charge stored at these locations can be increased or otherwise varied. This allows the cell 301 to be utilized for additional data storage. For example, different amounts of charge can correspond to different programmed states. In the example illustrated, for instance, both the left 315 and right 316 bit locations can be said to have four different states or levels, namely 1, 2, 3 and 4, where level 1 corresponds to a situation where the locations are blank or un-programmed, and levels 2, 3 and 4 correspond to increased amounts of stored charge, respectively. With regard to the left bit location 315, for example, a level 2 may correspond to a relatively small amount of stored charge 340, while levels 3 and 4 may correspond to increasingly larger amounts of stored charge 342 and 344, respectively. This technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in the example above, a single dual-bit cell may store two physical bits of data at each of four Vt levels corresponding to four logical states.

Figure 4A:
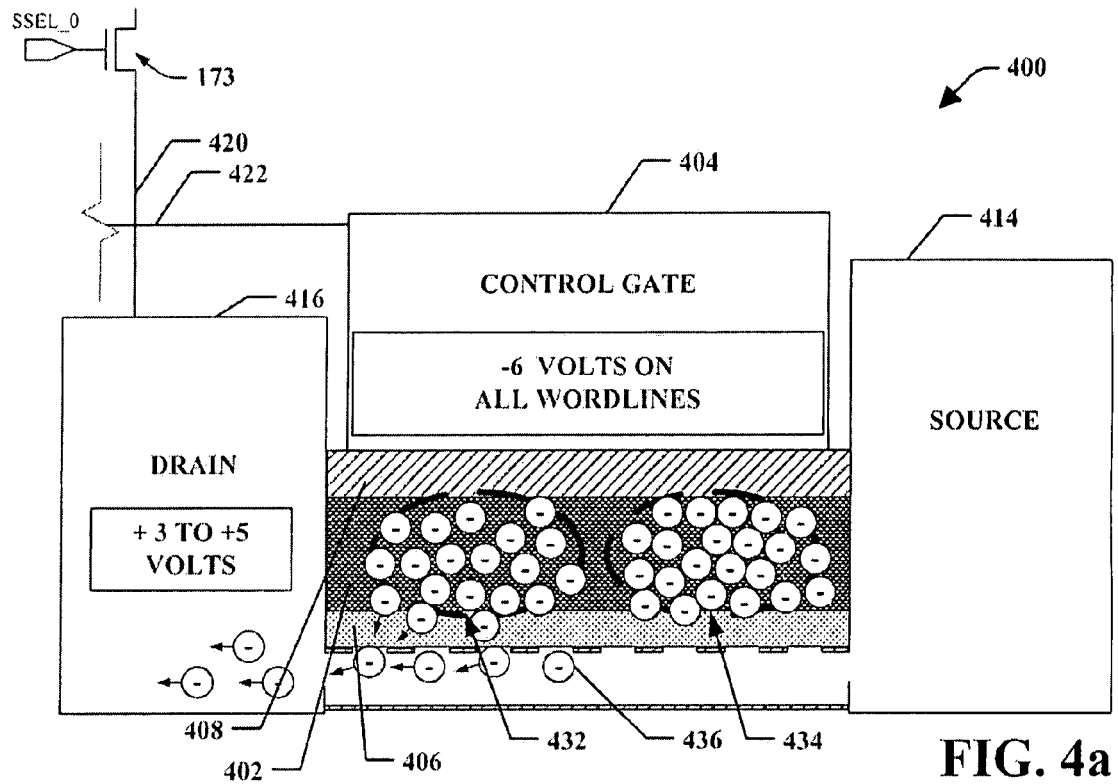
FIG. 4a is a schematic of an exemplary illustration of a prior art dual bit memory cell erasing a first bit.

The memory cell 400 of FIG. 4a of a conventional prior art system can be made up of a floating gate 402 (nitride layer) sandwiched between an isolation oxide layer 408 and a tunnel oxide layer 406. For example, a P-type substrate has buried N+ source 414 and N+ drain 416 regions. The floating gate 402 is often referred to as a charge trapping layer. Overlying the isolation oxide layer 408 is, for example, a polysilicon control gate 404. The control gate 404 can be doped with an N-type impurity (e.g., polysilicon). The memory cell 400 is capable of storing two data bits, a left bit 432 and a right bit 434 represented by the dashed circles. The dual bit memory cell 400 is generally symmetrical, thus the drain 416 and the source 414 are interchangeable. Thus, the left junction may serve as the drain 416 terminal and the right junction as the source 414 terminal with respect to the left bit 432. Likewise, the right junction may serve as the drain terminal and the left junction as the source terminal for the right bit 434. The control gate 404 can be supplied, for example, with a negative six volts (−6 V) by applying the voltage to an associated wordline through row decode circuitry (not shown). The drain 414 is then supplied with a positive three to five volts (+3 to +5V) from an x dec of row decoding circuitry (not shown) coupled to wordlines 422 when a sector comprising cells 401 is selected by a set of sector select circuits (SSEL) 173 coupled to bitlines 420. The negative voltage on the control gate 404 repels the electrons on the floating gate 402 and the drain 414 positive voltage attracts electrons 436, wherein the first bit area 432 is erased.

Figure 4B:
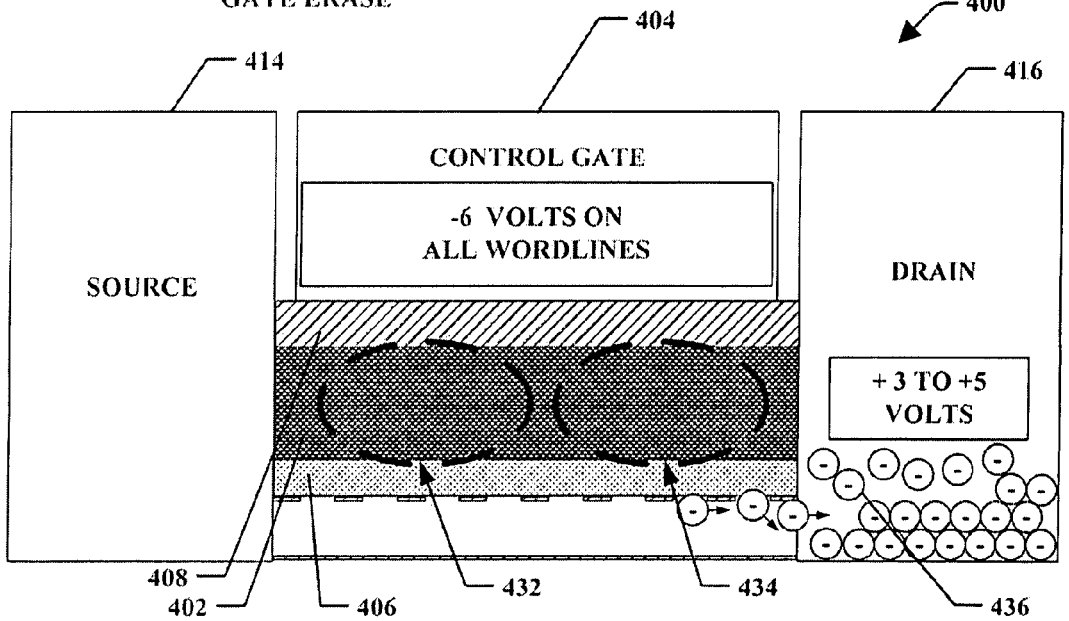
FIG. 4b is a schematic of an exemplary illustration of a prior art dual bit memory cell erasing a complementary second bit.

FIG. 4b illustrates a method for erasing ("1") a second bit 432 of a dual bit memory cell, at 400. The memory cell 400 of a prior art system can be made up of a floating gate 402 (nitride layer) situated in between a control oxide film 408 and a tunnel oxide film 406. The charge trapping layer or floating gate 402, for example, rests upon or bonds with the oxide film 408. A polysilicon control gate 404 can be a conductive polysilicon that is connected to a wordline, as mentioned above. The dual memory cell 400 can store at least two data bits, 432 and 434 shown in FIG. 4b as two dashed ovals. The dual bit memory cell 400 is generally symmetrical, thus the drain 416 and the source 414 are interchangeable, although the memory cell 400 could be non-symmetrical, as well. Thus, the left area can serve as the transistor source 414 and the right area can serve as the transistor drain 416 with respect to the right bit 434. Likewise, the right junction may serve as the source terminal and the left junction as the drain terminal for the left bit 432. The control gate 404 can be supplied, for example, with a constant negative 6 volts (−6V) by applying the voltage to an associated wordline. The drain 416 is then supplied with a constant positive 2 to 5 volts. The negative voltage on the control gate 404 repels electrons 436 on the floating gale 402 and the drain 414 positive voltage attracts the electrons, wherein the second bit area 434 is erased.

Various implementations of dual bit memory cell erasure may be verified according to one or more aspects of the conventional art. In particular, this description of current art is applicable to memory devices wherein both bits in the dual bit cells (e.g., 432 and 434) are used for data or information storage. The erasure verification method comprises the steps of performing a determination of whether the first bit 432 in the dual bit memory cell is properly erased, performing a first verification of whether the second bit 434 in the dual bit memory cell 400 is properly erased if the first bit 432 is properly erased, and determining that the dual bit memory cell 400 is properly erased if the first bit 432 is properly erased and if the second bit 434 is properly erased according to the first verification.

Figure 5A:
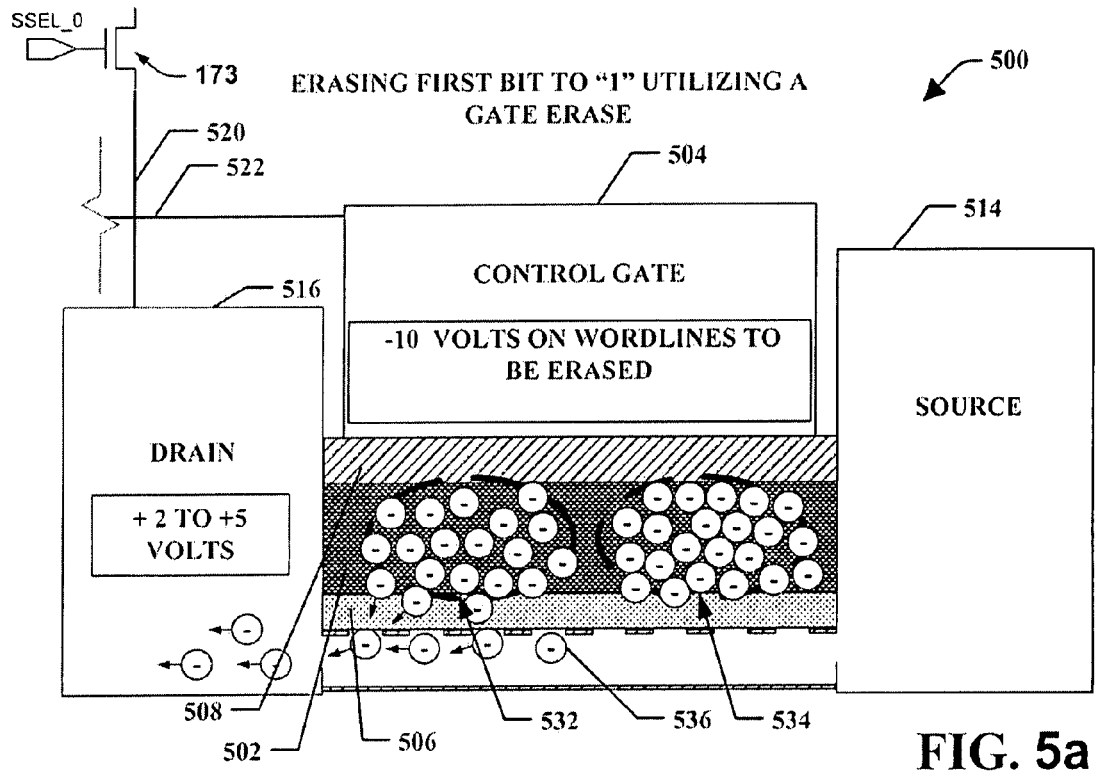
FIG. 5a is a schematic block diagram of an exemplary dual bit memory cell erasing a first bit by employing an erase voltage on a control gate, according to yet another aspect of the present disclosure.

One embodiment of the present disclosure, illustrated in FIG. 5a, is a core memory cell 500 of a core sector (electrical sector) in a larger physical sector (not shown) made up of a floating gate 502 (nitride layer) sandwiched between an isolation oxide layer 508 and a tunnel oxide layer 506. For example, a P-type substrate has buried N+ source 514 and N+ drain 516 regions. The floating gate 502 is often referred to as a charge trapping layer. Overlying the isolation oxide layer 508 is, for example, a polysilicon control gate 504. The control gate 504 can be doped with an N-type impurity (e.g., polysilicon). The memory cell 500 is capable of storing two data bits, a left bit 532 and a right bit 534 represented by the dashed circles. The dual bit memory cell 500 is generally symmetrical, thus the drain 516 and the source 514 are interchangeable. Thus, the left junction may serve as the drain 516 terminal and the right junction as the source 514 terminal with respect to the left bit 532. Likewise, the right junction may serve as the drain terminal and the left junction as the source terminal for the right bit 534. The control gate 504 can be supplied, for example, with a high voltage of negative ten volts (−10 V) by applying the voltage to an associated wordline 522 through an x-dec within row decode circuitry (not shown). The drain 516 is then, for example, supplied with a positive two to live volts (+2 to +5 V) from column decode circuitry (not shown) coupled to each wordline 522 upon selection of the particular core sector by a set of sector select circuits (SSEL) 173 coupled to each selected bitline 520. The negative voltage on the control gate 504 repels the electrons on the floating gate 502 and the drain 514 positive voltage attracts electrons 536, wherein the first bit area 532 is erased.

The control gate 504 voltage, for example, can be set to about negative ten volts (−10 volts), and the drain 516 can, for example, be set initially to positive two volts (+2 volts). During the first, second and third control gate voltage pulses, the memory cell voltage arrangement comprises a negative ten volts (−10 volts) at the control gate 504, two volts (+2 volts) at the drain 516 and zero volts (0 volts) at the source 514 (virtual ground). With each pulse a number of memory bits comprising a core cell (not shown) within a given memory sector are erased. In accordance with the present disclosure, core cells of other memory sectors that are not chosen for erase are concurrently inhibited from being erased by an inhibiting/protective voltage applied by circuitry of a peripheral decoder and/or control circuit for programming (writing), reading or erasing functions, as discussed infra.

It is to be appreciated, that although this disclosure refers to drain 516 voltages that increase incrementally in some fashion, the invention can make use of control gate 504 voltages that increase, control gate 504 voltages that decrease, control gate voltages that both increase and decrease, drain voltages that increase, drain voltages that decrease, drain voltages that both increase and decrease, source voltages that increase, source voltages that decrease, source voltages that both increase and decrease, and the like, or any combination thereof.

Figure 5B:
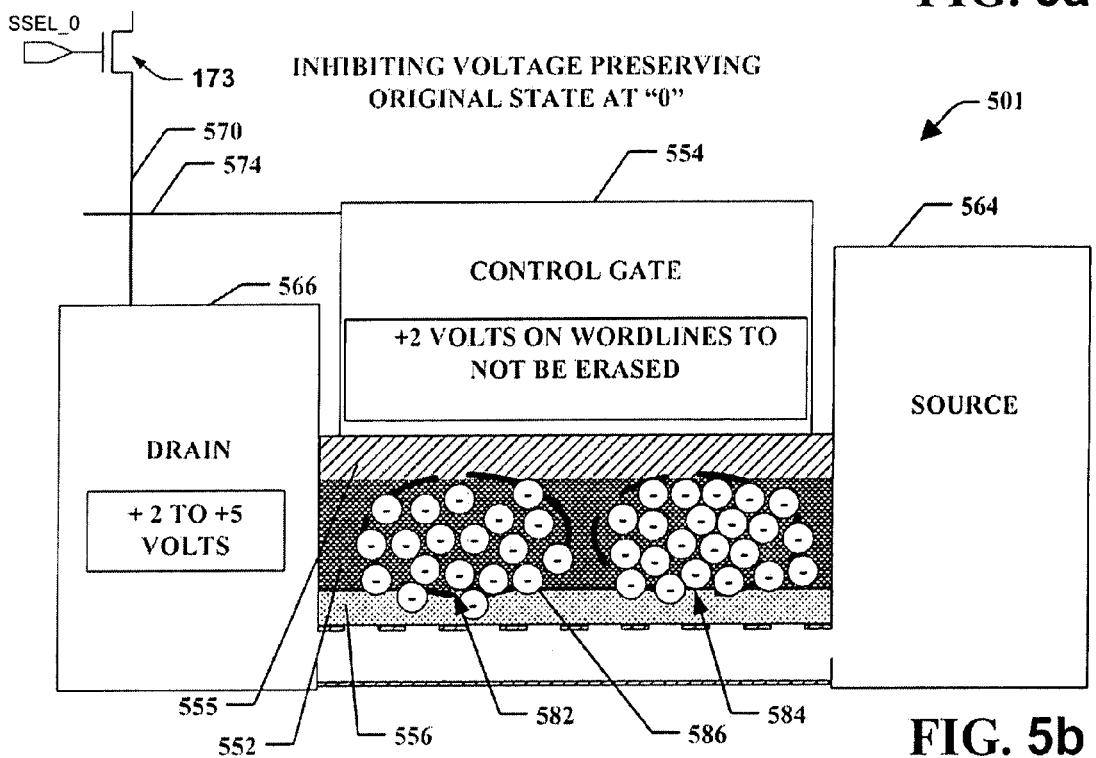
FIG. 5b is a schematic of an exemplary illustration of a dual bit memory cell providing an inhibiting voltage to a wordline of the same sector as wordlines being erased according to yet another aspect of the present disclosure.

In yet another embodiment of the present disclosure, FIG. 5b illustrates at 501, an inhibiting voltage of about two volts (+2V) being applied to a wordline 574 concurrently while the erase voltage in FIG. 5a is being applied to wordline 522. The cell 501 is made up of a floating gate 552 (nitride layer) sandwiched between an isolation oxide layer 555 and a tunnel oxide layer 556. For example, a P-type substrate has buried N+ source 564 and N+ drain 566 regions. The floating gate 552 is often referred to as a charge trapping layer. Overlying the isolation oxide layer 555 is, for example, a polysilicon control gate 554. The control gate 554 can be doped with an N-type impurity (e.g., polysilicon). The memory cell 501 is capable of storing two data bits, a left bit 582 and a right bit 584 represented by the dashed circles. Applying a positive voltage to wordlines of cells not chosen for erase prevents those core cells from becoming an erased "1" and preserves their original state. A control gate 554 can be supplied, for example, with a positive two volt (+2V) inhibiting voltage by applying the voltage to an associated wordline 574 through the same x-dec within row decode circuitry (not shown) in which applies the exemplary negative ten volts (−10 volts) to wordline 522 for erase. A drain 566 is then supplied with a positive two to live volts (+2 to +5 V) from column decode circuitry (not shown) coupled to each bitline 570 upon selection of the specific core sector by a set of sector select switches (SSEL) 173 coupled to each bitline 570. The positive voltage on the control gate 554 attracts the electrons on the floating gate 552 and the drain 566 positive voltage attracts electrons 586, wherein the dual bit area 582 is preserved, for example.

Verification of proper erasure of both bits, 532 and 534, in a dual bit memory cell configuration according to a method ensures that data retention and/or bit over-erase problems associated with one of the bits in the cell do not adversely affect the operation (e.g., proper erasure, read/write functionality) of the other or complementary bit. It is to be appreciated that the gate voltage can be incremented in various ways both linearly and non-linearly.

Figure 6B:
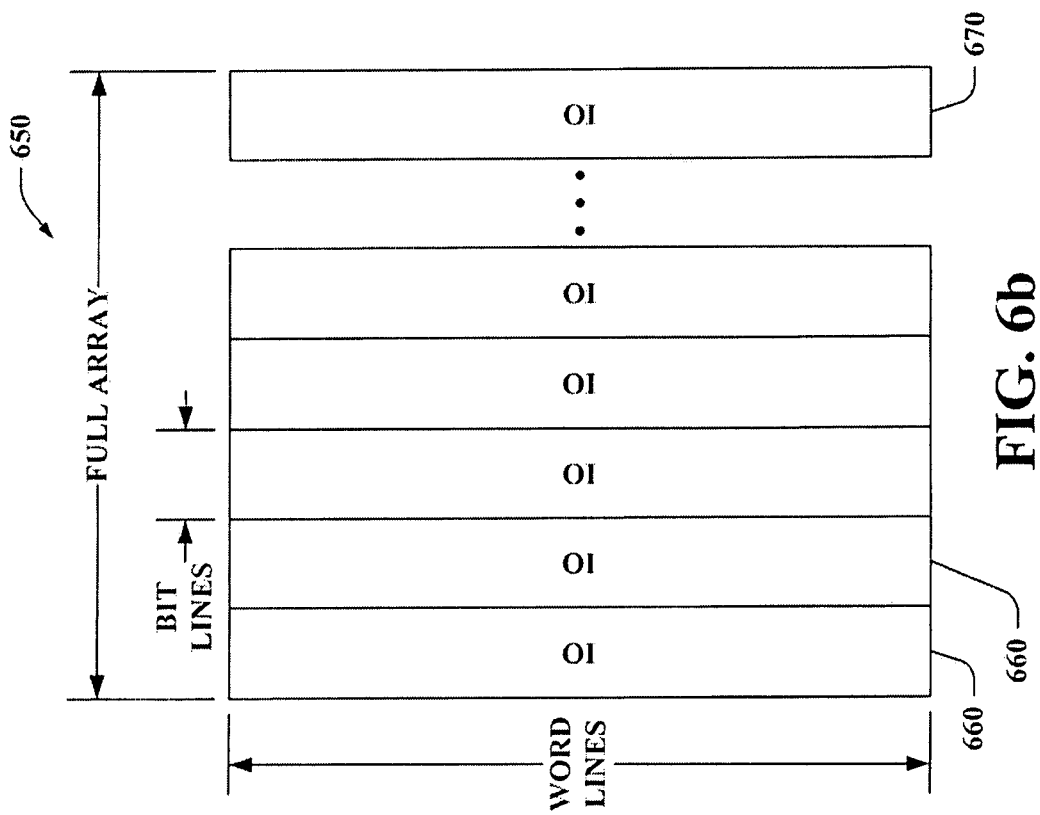
FIG. 6b is a schematic diagram illustrating a configuration of a number of memory sectors into a larger memory array.
Figure 6A:
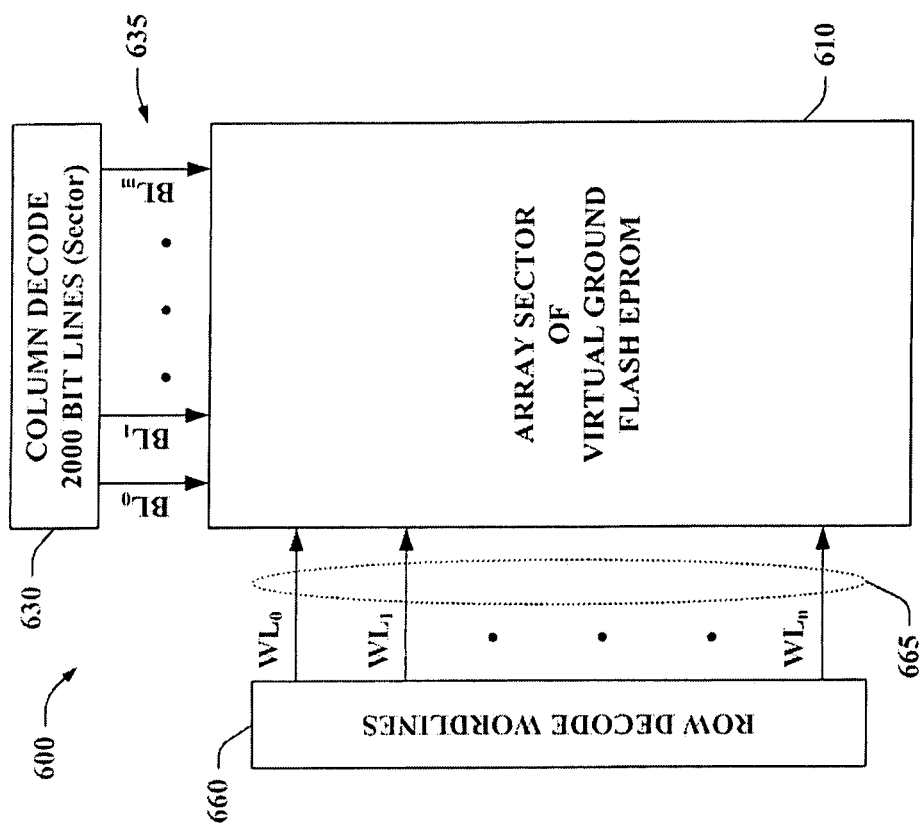
FIG. 6a is a schematic diagram illustrating a virtual ground array of memory cells together with wordline and bitline decode circuitry.

FIG. 6a illustrates an array sector IO 600 of virtual ground configuration flash memory cells 610, wherein the IO 600 comprises both row decode logic circuits 660 for selecting one or more wordlines 665, and column decode logic circuits 630 for selecting two or more bitlines 635. A conventional array sector IO may comprises for example, five hundred twelve rows and sixty-four columns of memory cells, which are associated with wordlines and bitlines, respectively. The array sector IO 600 of FIG. 6b is much more compact than a conventional sector array. For example, the physical sector array 610 of FIG. 6b comprises two hundred fifty-six wordlines to at least about two thousand forty-eight bitlines. Any array configuration comprising any number of bitlines and/or wordlines may comprise the present disclosure and is contemplated as being within the scope of the disclosure. In one embodiment, the sector stack may comprise a sixteen sector array, in which comprises eight thousand wordlines. For example, the sector may comprise five hundred twelve wordlines and one thousand bitlines. Each wordline corresponds with a row and each bit line a column. For example, five hundred twelve rows, and one-thousand columns of memory cells 610, associated with wordlines 665 and bitlines 635, respectively. As illustrated in FIG. 6b, a full memory array or physical sector 650 may comprise 2" such array sectors. For example, 1, 2, 4, 8, or 16 such array sector IOs 660 and 670 with associated wordline and bitline decode logic (not shown).

Figure 7A:
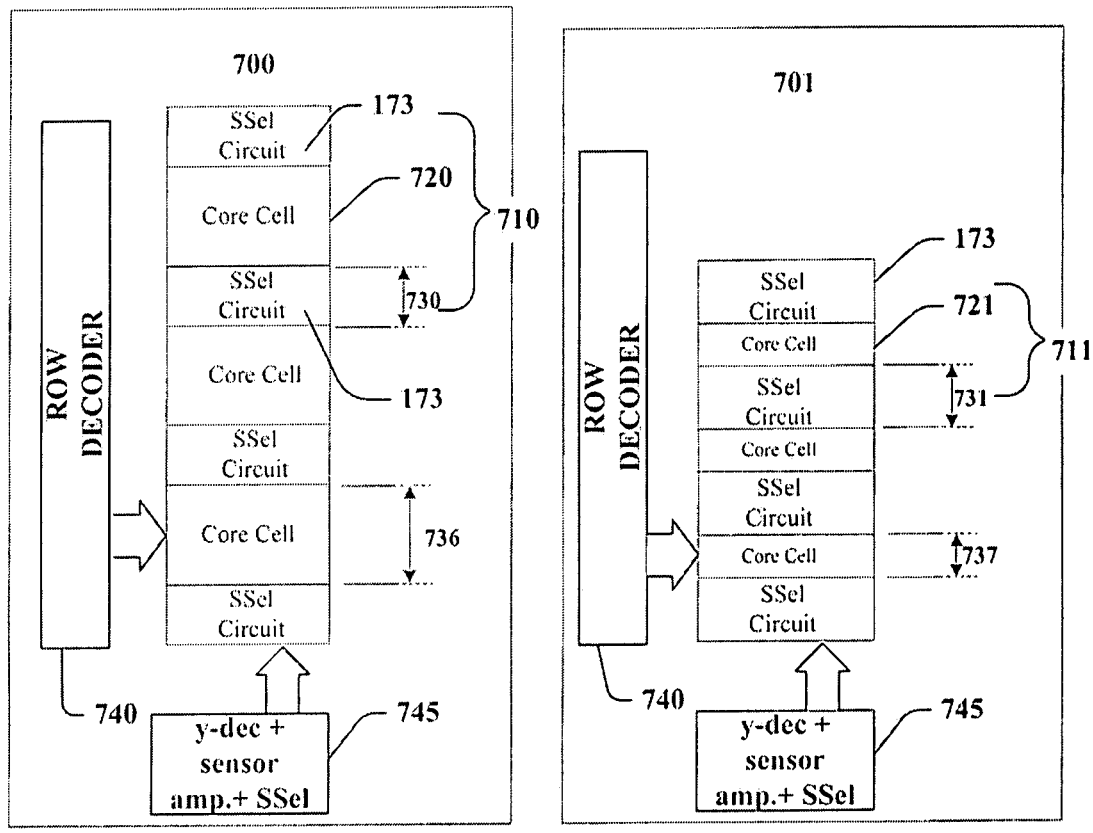
FIG. 7a is a schematic diagram illustrating wordline and bitline decode circuitry with peripheral sector select circuitry of prior art.

FIG. 7a illustrates, as an example, a simplified top plan view of an integrated circuit die 700 and 701 including an EEPROM sector 710 and 711 respectively, a row decoder 740 with an erase control circuit, and a column decoder and sense amplifier circuit 745. In response to control signals and an address provided by a controller (not shown), the row decoder circuit 740 generates the appropriate voltages to the word lines $WL_0$ thru $WL_n$, and the column decoder of the column decoder and sense amplifier circuit 745 provides the appropriate voltages to the bit lines BL0-BLn to program, erase, or read selected EEPROM cells of the EEPROM cell array 710 and 711. The sense amplifiers of the column decoder and sense amplifier circuit 745 sense the currents flowing through the selected EEPROM cells of the EEPROM cell array 710 in order to read their programmed states.

The integrated circuit die 700 demonstrates an example of a conventional configuration with an array 710 and core cells 720 of width 736. As modern day flash memory demands push for smaller and smaller area while maintaining or increasing density, the technology has scaled down the size of the core cells 720 to an exemplary width 737 of the core cells 721. For example, an amount of dimensional space of an actual physical sector 710 comprising a core cell 720 and a set of sector select circuits 173 on a die 700 is reduced to a lesser amount of dimensional space for a physical sector 711 on die 701. Therefore, conventional art has been able to reduce the amount of core cell area comprised by a die, but the peripheral circuitry involving sector select circuits 173 has typically remained the same.

Figure 7B:
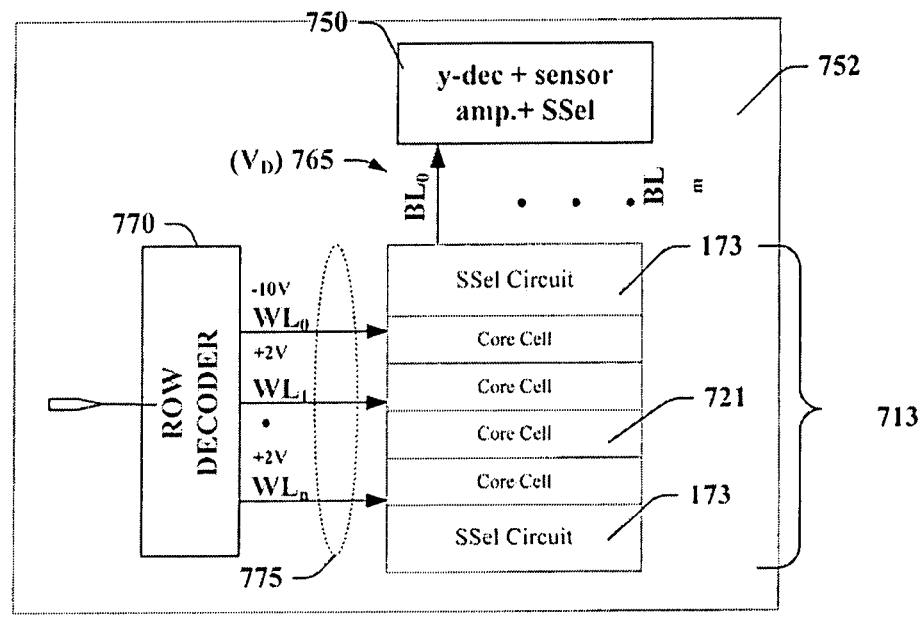
FIG. 7b is a schematic diagram illustrating wordline and bitline decode circuitry with peripheral sector select circuitry according to an aspect of the present disclosure.

Turning to FIG. 7b, an embodiment of the disclosure is illustrated wherein one sector select circuit 173 is attributed to a much greater number of electrical sectors or core cells 721 within a denser physical sector array 713 compared to the sectors 710 and 711 of conventional art. FIG. 7b illustrates a simplified top plan of a high density EEPROM physical sector 713 of an integrated circuit die 752, a row decoder circuit 770, and a column decoder and sense amplifier circuit 750 wherein the column decoder comprises the set of sector select circuits 173 and is coupled to bitlines 765. Any number of $2^n$ core cells 721 may be attributed to only one set of sector select circuits 173, as contemplated within the scope of the disclosure, wherein n denotes any positive integer and zero. For example, FIG. 7B comprises a physical sector 713 with a set of sector select circuits 173 with wordlines 775 of a density of 4 MB wherein each core cell 721 represents a sector of about 1 MB density. Therefore, wherein the physical sector 711 of prior art in FIG. 7a had a density of 1 MB with the set of two sector select circuits 173, the physical sector 713 of the present disclosure may comprise about 4 MB with one set of two sector select circuits 173 shared among all four core cells 720 comprising 1 MB sectors each. The set of sector select circuits 173 in the present embodiment may be shared among any number of $2^n$ core cells 721, for example, wherein each core cell representing sectors of about 1 MB density. For example, the number of sectors of a particular physical sector may be 1, 2, 4, 8, 16, etc.

In another embodiment, a row decoder 770 concurrently provides a protective voltage across wordlines in a physical sector 713 to core cells 721 not chosen for erase. As one example illustrated in FIG. 7b demonstrates, WL1 thru WLn are provided a positive two voltage front the row decoder 770, while WL$_o$ is concurrently chosen for erase and provided a very high negative voltage, for example, negative ten volts (−10V). The positive voltages, for example, positive two volts (+2V) provided across the wordlines not intended for erase act as inhibiting voltages across the gates of core cells and protect from erasure or prevent programming cells of the sector to a "1." The row decoder 770 thereby allows the peripheral sector select circuitry 173 to be reduced within column decode logic 750 and enable a denser sector 713 between each set of sector select 173 peripheral circuits.

Although this disclosure refers to positive inhibiting voltages provided along wordlines, it is appreciated that any voltage capable of inhibiting erasure is contemplated within the scope of the disclosure. For example, a range of voltages from a positive one volt (+1V) to positive seven volts (+7V) may be contemplated for purposes of protection and/or inhibition of erasure (for example, 4V). An erase voltage of any high difference potential relative to the inhibiting voltage may also be contemplated.

Figure 8:
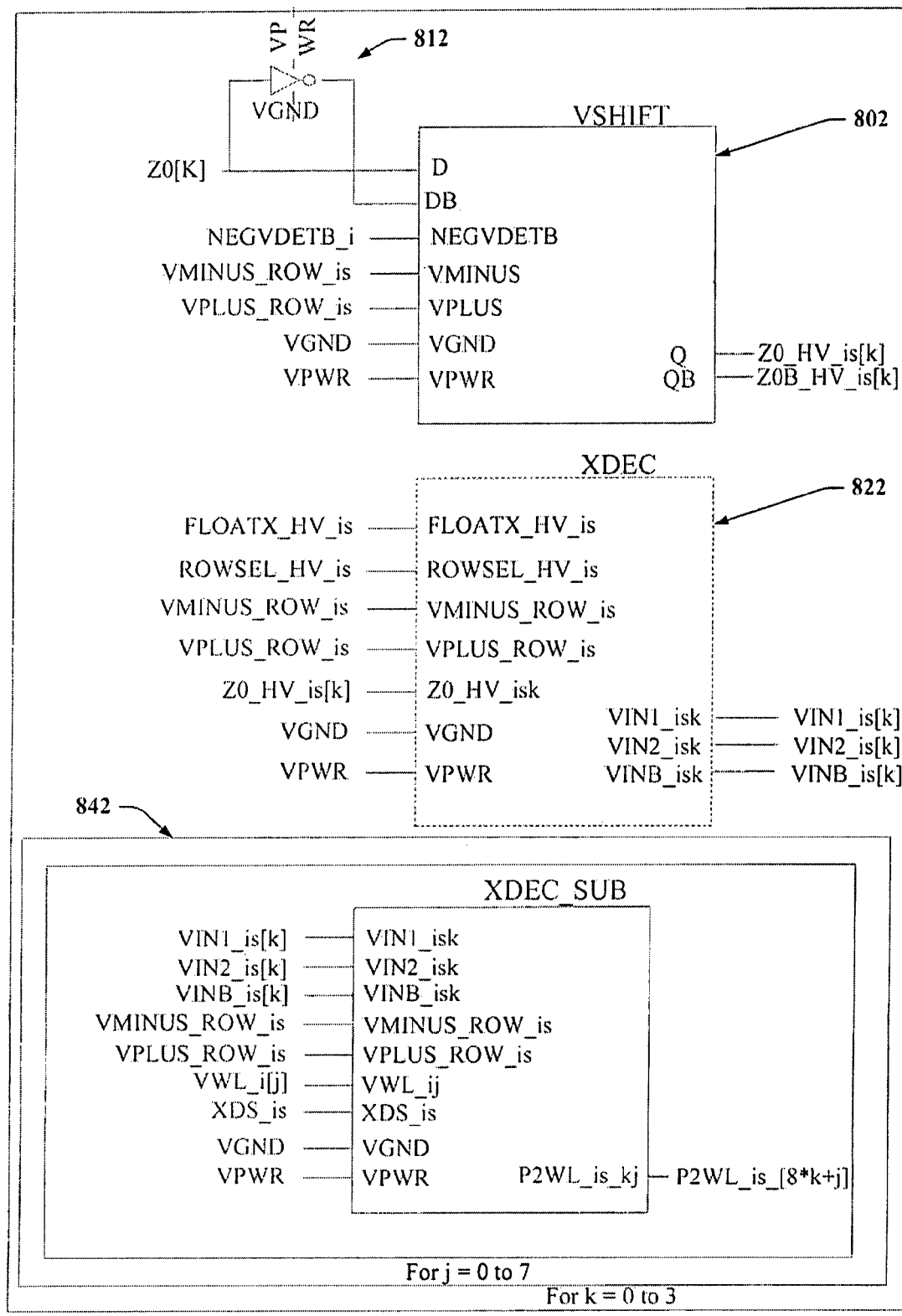
FIG. 8 is a schematic diagram illustrating row decode circuitry according to another aspect of the present disclosure.

FIG. 8 illustrates one embodiment of a row decoder 800 capable of providing inhibiting voltage along wordlines while concurrently providing an erase voltage to a particular sector and/or sectors to be erased. For example, FIG. 8 illustrates further a simplified lay-out of the row decoder 800 portion of a high density EEPROM allowing only one set of sector select peripheral circuits within a column decoder or y decoder and shared among the core cells of a physical sector (not shown). The row decoder 800 comprises three stages (VSHIFT 802, XDEC 822, and XDEC_SUB 842) wherein the number of x-dec circuits 822 is minimized to only one per row decoder 800 instead of one per wordline, as in conventional art.

The first stage VSHIFT 802 of the row decoder 800 is also a shifter 802 to create a high voltage (HV) gate control signal output (Z0_HV_is[k] and Z0B_HV_is[k]) for the x-dec 822 of the second stage. Regulators (not shown) generate a positive and/or a negative row voltage coupled to the shifter 802 as inputs NEGVETB_i, VMINUS_ROW_is, and VPLUS_ROW_is. An input decoding signal Z0 coupled to an inverting amplifier 812 is used for determining which sector would be chosen for an erase and/or protection from erase. The inputs (NEGVETB_i, VMINUS_ROW_is, and VPLUS_ROW_is) are combined by the shifter VSHIFT 802 with the decoding signal Z0 to generate the high voltage signal outputs Z0_HV_is[k] and Z0B_HV_is[k], which are current decoding signals for the XDEC 822.

In another embodiment, an exemplary x-dec 822 is coupled to $2^n$ number of wordlines, wherein n is any positive integer and zero. In an exemplary high density EEPROM device, such as in FIG. 8, eight core cells are provided for wherein j, representing the number of rows is equal to 8 and j=0 to 7 respective core cells (not shown). Each core cell sector having a density of 1 MB shares a set of sector select circuits located within column decode circuitry with a larger physical sector (not shown) comprising a density of 8 MB or eight core cell sectors coupled to row decode circuitry 800 in the example of FIG. 8. As an alternative, the number of core cells may be 1, 2, 4, 8, 16, 32, etc. core sectors coupled to the same x-dec and sharing one set of sector select circuits. In another embodiment of the disclosure the XDEC_SUB 842 or x-dec sub circuit 842 within the row decoder 800 passes a high voltage from the positive or negative voltage generated to wordlines of a physical sector.

Figure 9A:
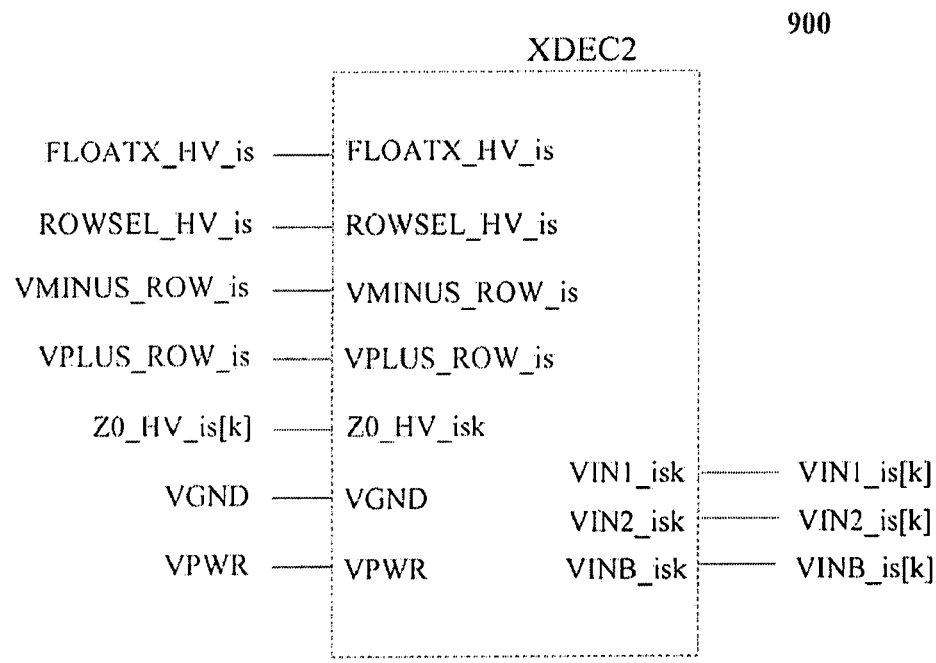
FIG. 9a is a schematic diagram illustrating x-dec circuitry according to yet another aspect of the present disclosure.
Figure 9B:
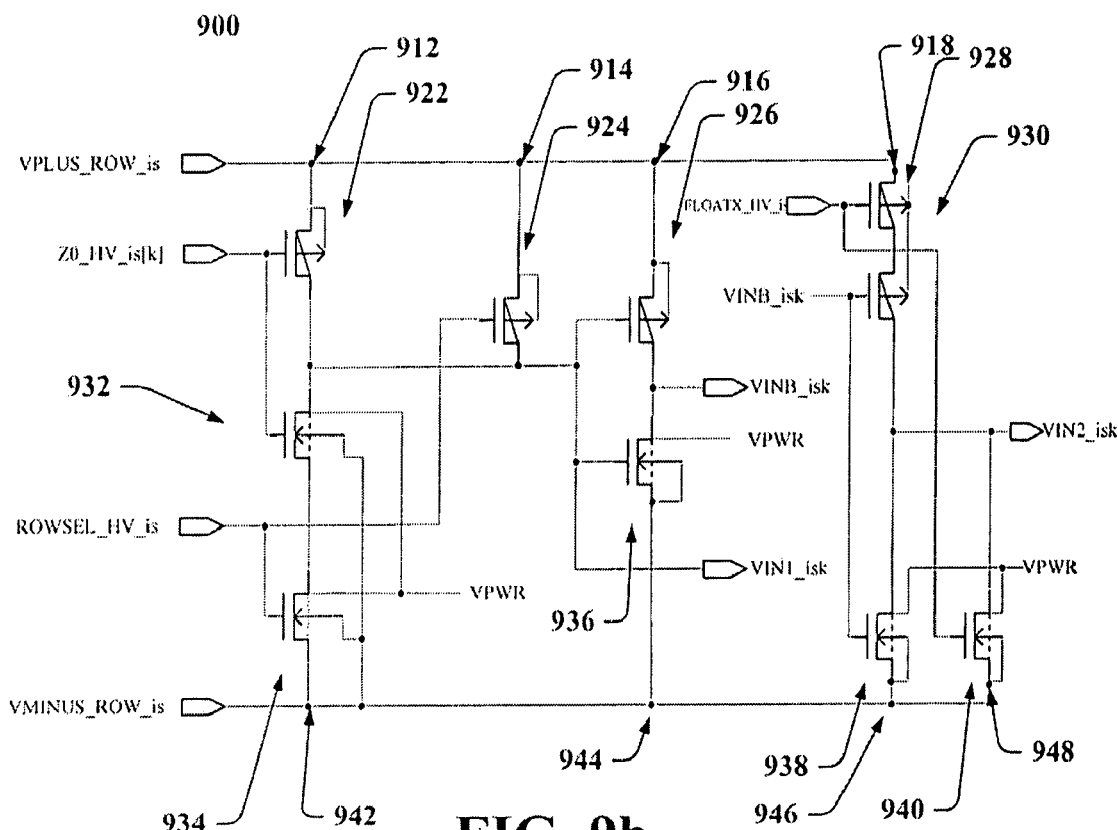
FIG. 9b is a schematic diagram illustrating x-dec circuitry according to an aspect of the present disclosure.

Referring to FIG. 9a and 9b, one example of an x-dec configuration is illustrated wherein the x-dec 900 or XDEC2 generates HV gate control signals (VIN1_is[k], VIN2_is[k], and VTNB_is[k]) to pass a positive or a negative voltage to wordlines of a particular physical sector of a high density EEPROM array of any type of architecture including ORNAND/NOR/NAND, virtual ground type architecture as well as any memory array utilizing sector select circuitry for the selection of specific sectors to be addressed for erase throughout a semiconductor die. In another embodiment, the memory cells can comprise, but are not limited to electric programmable read only memory (EPROM) cells, Hash memory cells, ROM cells, and ferro-electric random access memory (FRAM) cells. Conventionally, the x-dec was capped at ground in order for wordlines subject to an erase to get a very negative voltage. This required additional circuitry and therefore additional overhead. However, in the present configuration the inputs VMINUS_ROW_is and VPLUS_ROW_is are passed through the x-dec 900 along with the determined current decoding signal Z0_HV_is[k] and/or Z0B_HV_is[k. Furthermore, the x-dec 900 generates the HV gate control signals VIN1_is[k], VIN2_is[k], and VINB_is[k] as outputs coupled to the third stage of the decoder, the x-dec sub circuit 1000 illustrated in FIGS. 10a and 10b.

Another embodiment is illustrated in FIG. 9b. An example of an x-dec configuration is illustrated wherein the x-dec 900 generates HV gate control signals (VIN1_is[k], VIN2_is[k], and VINB_is[k]) to pass a positive or a negative voltage to wordlines of a physical sector through PMOS transistors 922, 924, 926, 928 and 930, and NMOS transistors 932, 934, 936, 938, and 940. The positive row voltage (VPLUS_ROW_is) is coupled to source terminals 912, 914, 916, and 918 of respective PMOS transistors 922, 924, 926, 928 and 930. The negative row voltage (VMINUS_ROW_is) is coupled to source terminals 942, 944, 946, and 948 of respective NMOS transistors 932, 934, 936, 938, and 940. The HV current decoding signal Z0_HV is[k] is coupled to gate terminals of transistors 922 and 932 and ROWSEL_HV_is is coupled to gate terminals of transistors 924 and 934. The x-dec 900 therein generates the HV gate control signals VIN1_is[k], VIN2_is[k], and VINB_is[k] as outputs coupled to the third stage of the decoder, the x-dec sub circuit 1000 illustrated in FIGS. 10a and 10b.

Figure 10A:
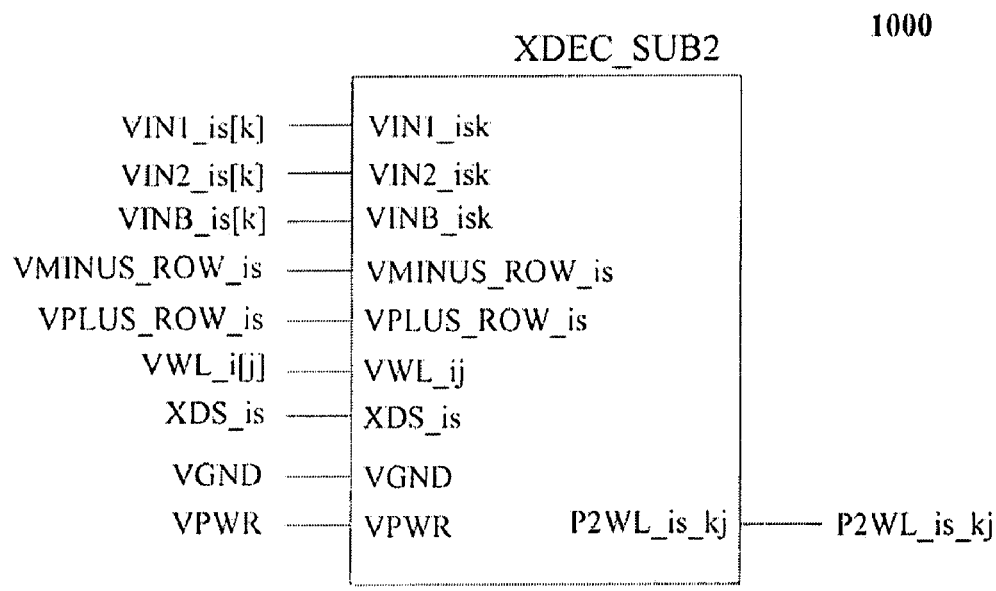
FIG. 10a is a schematic diagram illustrating x-dec sub circuitry according to an aspect of the present disclosure.
Figure 10B:
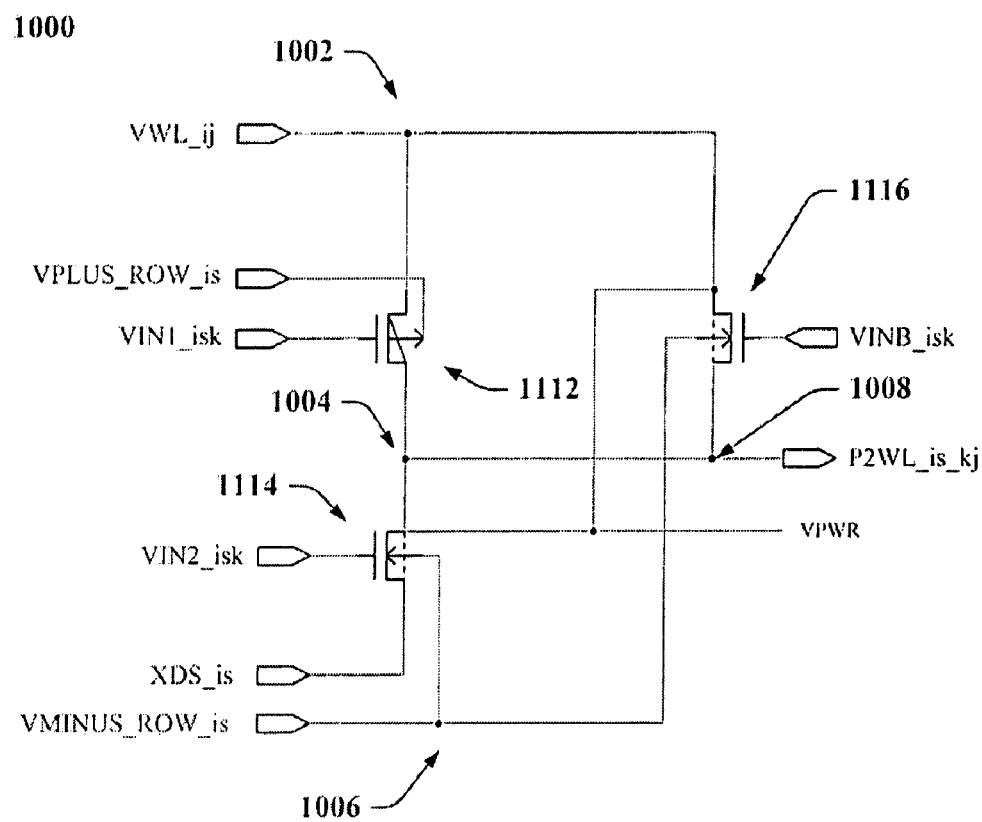
FIG. 10b is a schematic diagram illustrating x-dec sub circuitry according to an aspect of the present disclosure.

Illustrated in FIGS. 10a and 10b is example of an x-dec sub circuit or XDEC_SUB2 1000 wherein an inhibiting voltage of about positive two volts (+2V) to positive five volts (+5 V) that is able to protect wordlines not chosen for an erase. For example, +3 V may be chosen. Any inhibiting voltage capable of preventing the loss of a current programming, for example a "0" to a "1," is contemplated as being within the scope of the disclosure. Therefore, any voltage contemplated to prevent or inhibit the drain voltage of a memory cell from sufficiently attracting electrons of a given bit and thereby causing an erase is contemplated as being within the scope of the disclosure.

The XDEC_SUB2 1000 of FIG. 10*a* generates a high voltage from a positive or negative voltage to wordlines of a physical sector by a poly2wordline output (P2WL_is_[8*k+ j], wherein HV positive voltage is generated from a voltage wordline (VWL) node or a HV negative from the negative voltage (or a float as another option). Because wordlines of a particular core cell conventionally were capped to ground when not provided with a high negative erase voltage, different HV control circuitry was needed. However, in the present embodiment for example, only one x-dec 822 is needed along with the first stage shifter 802 to ensure that correct positive or negative voltage is passed to wordlines of a physical sector. In another example, the XDEC_SUB 842 is repeated any number of times as necessary for a particular sector to receive poly wordline voltages either for erase and/or inhibition of an erase.

Illustrated in FIG. 10*b* is another embodiment of an x-dec sub circuit 1000. An example of a configuration of the x-dec sub circuit 1000 is illustrated wherein an output voltage at the P2WL_is_kj output terminal is generated. A VWL_ij node is used to pass a positive high voltage therefrom. The VWL_ij input is coupled to the source terminal 1002 of PMOS transistor 1112 and NMOS transistor 1116. The positive row voltage (VPLUS_ROW_is) is coupled to the source terminal 1002 of PMOS transistor 1112 and XDS_is is coupled to the source terminal 1004 of transistor 1114. XDS_is supplies the lowest voltage that can be passed to the wordline. Negative inhibiting voltages will, therefore be supplied here. VPLUS_ROW_is is coupled to the bulk or body terminal 1006 of transistors 1114 and 1116. The HV gate control signals VIN1_isk, VIN2_isk, and VINB_isk are coupled to the gate terminals of transistors 1112, 1114, and 1116 respectively. The output P2WL_is_kj is tapped off from the drain terminals 1004, 1008 of transistors 1112 and 1116 respectively, to pass on either an inhibiting voltage or erase voltage. The number of x dec sub circuits can be more than 64 or less than 64 or 64 in all to a memory cell area that has 108 memory cells or more, or less than 108 memory cells.

The advantages of the row decoder of the present disclosure is that it allows for less sector select circuitry within any given column decoder and is functional for both hot-hole erased and channel erase discussed supra. Additionally, a greater density of memory cells can be controlled with less peripheral circuitry. Therefore, sector select overhead area is reduced on the semiconductor die.

Figure 11:
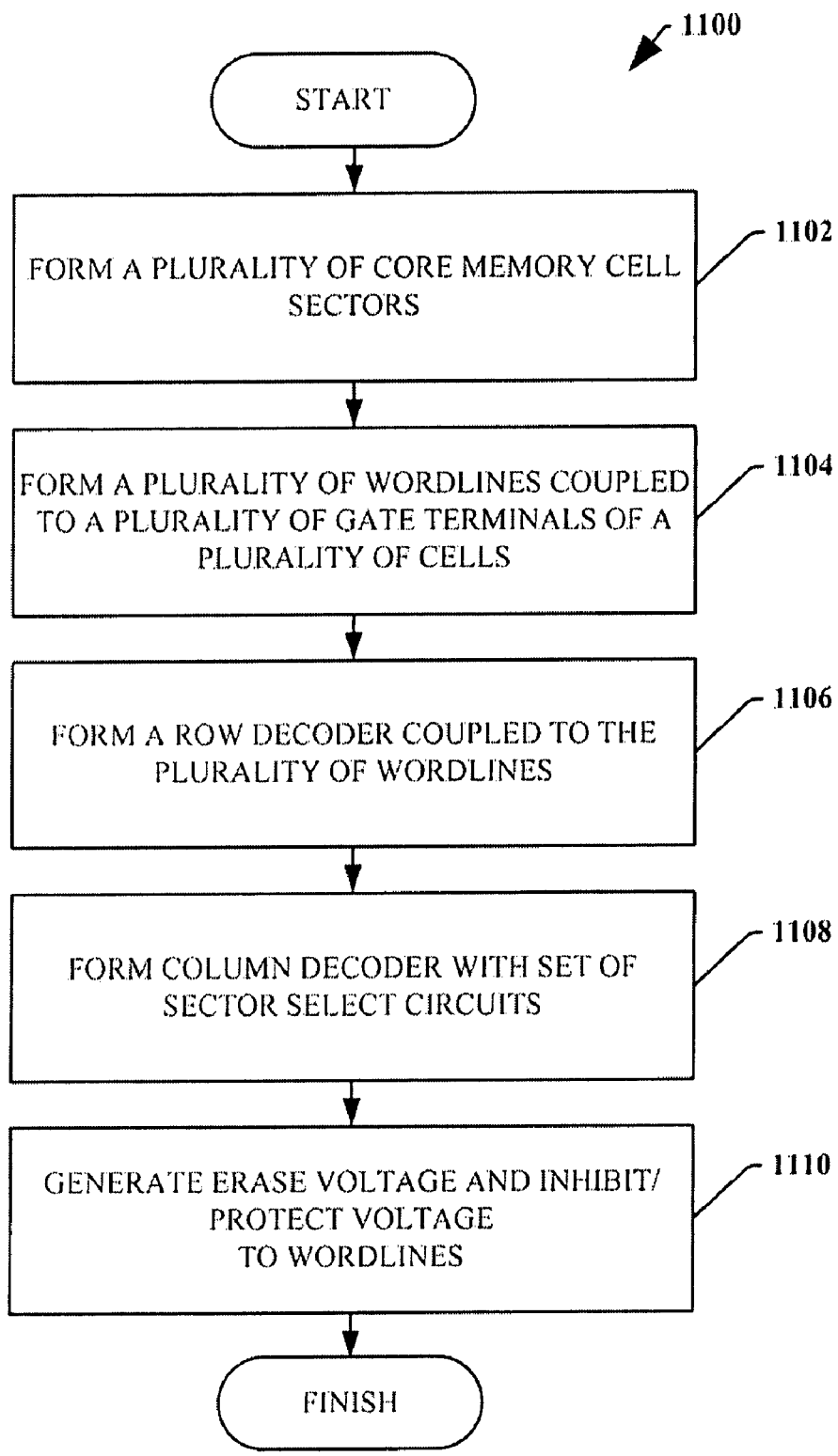
FIG. 11 is a flow chart illustrating an exemplary row decoder and column decoder technique, according to an aspect of the present disclosure.

Turning to FIG. 11, a methodology 1100 is illustrated that facilitates erasing bits of memory cells whether the memory is single bit, dual bit or multi-bit memory cells by providing an inhibiting voltage to wordlines of a sector not selected for erase or programming to a "1." The methodology is able to reduce overhead area of a semiconductor die while maintaining and/or improving efficiency of erase procedures. It will be appreciated that although the methodology of 1100 is illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Furthermore, one or more of the acts may be carried out in one or more separate acts or phases.

The method begins at start and proceeds to 1102 wherein core memory cells are formed and comprises cells similar to the cells 721 depicted in FIG. 7*b* for example. Then at 1104 all wordlines within each core sector are formed connecting gate terminals of a row of memory cells. At 1106 a row decoder is formed in accordance with the disclosure and described supra. The row decoder is coupled to wordlines formed at 1104. A column decoder with a set of sector select circuits coupled to each physical sector is formed at 1108. At 1110 all wordlines within any selected memory sector are provided with the same negative voltage that can range, for example, from −3.5 to −12 volts in virtual ground array architecture. For example, all of the wordlines can be set to −10 volts, and therefore all of the associated control gates are set to −10 volts. Setting only one wordline to −10 volts, in contrast, sets all control gates on the wordline to −10 volts. Concurrently to the erase voltage being generated to wordliness of a core cell sector, is a voltage of different potential, for example a positive two voltage, being generated to wordlines within the same physical sector to protect from or inhibit erase.

Although the method described above is an efficient method discussed herein, alternately, any pattern of control gate voltage can be employed with some steps of the invention and erasure can be performed utilizing a common associated erase pattern. Finally, individual cells may be erased according to the method. Other such bit and cell grouping arrangements are anticipated in accordance with the method of the present invention.

Figure 12:
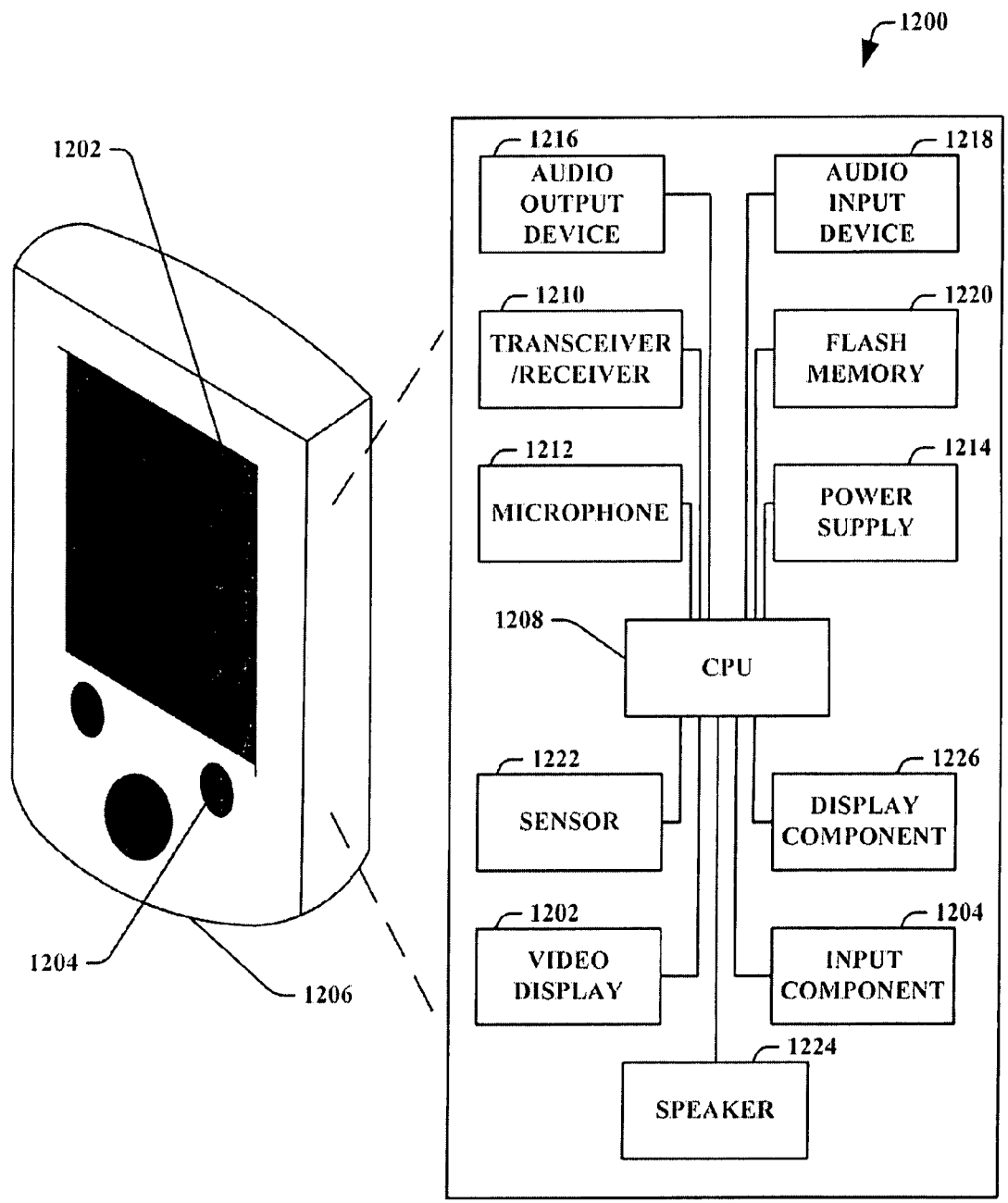
FIG. 12 is an isometric view of a device and block diagram according to yet one or more aspects of the present disclosure.

FIG. 12 is an exemplary portable electronic device, for example, a Personal Data Assistant (PDA) 1200 comprising a video display 1202, an input component 1204, a housing 1206, a CPU 1208, a transceiver and/or a receiver 1210, a microphone 1212, a power supply 1214, an audio output device 1216, an audio input 1218, flash memory 1220, various sensors 1222, and speaker(s) 1224. The flash memory 1220 utilizing dual bit and single bit memory devices manufactured with improved reliability and density by an x decoding circuit capable of reducing the number of sector selects per sector and accessing a particular core sector by concurrently providing an accessing voltage and an inhibiting voltage, per the present invention. The audio input device 1218 can be a transducer, for example. The input component 1204 can include a keypad, buttons, dials, pressure keys, and the like. The video display 1202 can be a liquid crystal display, a plasma display, an LED display, and the like, for displaying visual data and information. In accordance with another embodiment of the claimed subject matter, the portable device with flash memory 1220 manufactured according to the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 1220 can include random access memory, read only memory, optical memory, audio memory, magnetic memory, and the like.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A memory device, comprising:
   a physical sector comprising a plurality of core sectors organized in a virtual ground configuration;
      wherein the plurality of core sectors comprise:
         a plurality of memory cells;
         a plurality of gate terminals coupled to at least one wordline;
         a plurality of drain terminals coupled to at least one bitline;
         a plurality of source terminals coupled to at least one bitline;
   a decoder operatively coupled to the at least one wordline of the plurality of core sectors; and
   wherein the decoder comprises a shifter, an x-dec circuit, and at least one x-dec sub circuit;
   wherein the decoder is configured to maintain isolated control of the at least one wordline of the plurality of core sectors and further configured to inhibit at least one core sector by generating an inhibiting voltage to the at least one core sector within the physical sector.

2. The memory device of claim 1, wherein the physical sector comprises $2^N$ core sectors and N is any positive integer or zero.

3. The memory device of claim 1, wherein the physical sector is coupled to a decoder comprising a set of two sector select circuits shared among $2^N$ core sectors wherein N is any positive integer or zero.

4. The memory device of claim 1, wherein the shifter creates a high voltage gate control signal to the x-dec circuit.

5. The memory device of claim 1, wherein the x-dec circuit processes a gate control signal to the x-dec sub circuit.

6. The memory device of claim 1, wherein the at least one sub circuit generates a positive high voltage from a VWL node to the at least one wordline of the plurality of core sectors or a negative high voltage from a negative voltage or a float to the at least one core sector within the physical sector.

7. The memory device of claim 1, wherein each core sector is a density of about 1 MB.

8. The memory device of claim 1, wherein the decoder is a row decoder that is configured to concurrently generate an erase voltage to the at least one wordline of the plurality of core sectors while generating an inhibiting voltage to the at least one core sector within the physical sector.

9. The memory device of claim 1, further comprising a column decoder.

10. The memory device of claim 9, wherein the column decoder comprises a set of two sector select circuits coupled to and shared among the $2^N$ core sectors of the physical sector, wherein N is any positive integer.

11. A method of manufacturing a memory device, comprising:
    forming a physical sector comprising a plurality of core sectors;
    wherein each core sector comprises:
       a plurality of memory cells;
       a plurality of gate terminals coupled to at least one wordline;
       a plurality of drain terminals coupled to at least one bitline;
       a plurality of source terminals coupled to at least one bitline;
    isolating control of at least one core sector within the physical sector; and
    generating an inhibiting voltage to at least one wordline of the plurality of core sectors within the physical sector by a decoder;
    wherein the decoder comprises a shifter, an x-dec circuit, and at least one x-dec sub circuit.

12. The method of claim 11, wherein isolating control of the at least one core sector comprises generating a high voltage signal and wherein the decoder is a row decoder.

13. The method of claim 11, wherein isolating control of the at least one core sector comprises generating a positive voltage to the at least one wordline of the plurality of core sectors while concurrently generating a negative voltage to at least one core sector of the physical sector.

14. The method of claim 11, further comprising:
    forming a VWL node; and
    wherein generating the inhibiting voltage comprises generating a positive high voltage from the VWL node while concurrently generating a negative high voltage from a negative voltage or a float for isolating control.

15. The method of claim 11, wherein forming a memory device further comprises forming a column decoder.

16. The method of claim 11, wherein forming a column decoder comprises forming a set of two sector selects and a sensing amplifier.

17. The method of claim 11, wherein forming a physical sector comprises forming about 1000 to about 2048 bitlines and about 256 to about 512 wordlines.

18. The method of claim 11, wherein the accessing voltage is a negative voltage and the inhibiting voltage is a positive voltage.

19. A communication device, comprising:
    a flash memory CPU;
       the flash memory operatively coupled to the CPU and configured to transfer data to and from the CPU;
    an input component for entering the data;
    a display component for displaying information;
    a plurality of switches;
    flash memory;
    a physical sector; and
       a method of forming a physical sector comprising a plurality of core sectors;
    wherein each core sector comprises:
       a plurality of memory cells;
       a plurality of gate terminals coupled to at least one wordline;
       a plurality of drain terminals coupled to at least one bitline;
       a plurality of source terminals coupled to at least one bitline; isolating control of at least one core sector within the physical sector; and
    generating an inhibiting voltage to at least one wordline of the plurality of core sectors within the physical sector by a decoder while concurrently generating an erase voltage to at least one wordline of the plurality of core sectors;
wherein the decoder comprises:
 a row decoder
 a circuit for generating a high voltage signal;
 a sub circuit for passing a control signal for a negative voltage to be generated to at least one wordline of the plurality of core sectors or a positive voltage to at least one core sector of the plurality of core sectors;

wherein generating the inhibiting voltage comprises generating a high positive voltage from a VWL node; and
wherein generating the negative voltage comprises generating a high negative voltage from a minus voltage or a float;
forming a column decoder comprising a sense amplifier and two sector select circuits coupled to and shared among the plurality of core sectors.

* * * * *